(12) United States Patent
Aichinger et al.

(10) Patent No.: US 10,586,845 B1
(45) Date of Patent: Mar. 10, 2020

(54) SIC TRENCH TRANSISTOR DEVICE AND METHODS OF MANUFACTURING THEREOF

(71) Applicant: Infineon Technologies AG, Neubiberg (DE)

(72) Inventors: Thomas Aichinger, Faak am See (AT); Wolfgang Bergner, Klagenfurt (AT); Paul Ellinghaus, Unterhaching (DE); Rudolf Elpelt, Erlangen (DE); Romain Esteve, Munich (DE); Florian Grasse, Hohenthurn (AT); Caspar Leendertz, Munich (DE); Shiqin Niu, Freising (DE); Dethard Peters, Hoechstadt (DE); Ralf Siemieniec, Villach (AT); Bernd Zippelius, Erlangen (DE)

(73) Assignee: Infineon Technologies AG, Neubiberg (DE)

(*) Notice: Subject to any disclaimer, the term of this patent is extended or adjusted under 35 U.S.C. 154(b) by 0 days.

(21) Appl. No.: 16/193,296

(22) Filed: Nov. 16, 2018

(51) Int. Cl.
  *H01L 29/06* (2006.01)
  *H01L 29/16* (2006.01)
  (Continued)

(52) U.S. Cl.
  CPC .... *H01L 29/0611* (2013.01); *H01L 21/26506* (2013.01); *H01L 27/088* (2013.01);
  (Continued)

(58) Field of Classification Search
  CPC ............. H01L 29/0611; H01L 29/4236; H01L 27/088; H01L 29/66068; H01L 21/26506; H01L 29/1608
  See application file for complete search history.

(56) References Cited

U.S. PATENT DOCUMENTS

| | | |
|---|---|---|
| 4,823,172 A | 4/1989 | Mihara |
| 6,008,520 A | 12/1999 | Darwish et al. |

(Continued)

FOREIGN PATENT DOCUMENTS

| | | |
|---|---|---|
| DE | 102004029297 A1 | 11/2005 |
| DE | 102005041358 A1 | 3/2007 |

(Continued)

OTHER PUBLICATIONS

Hsu, Fu-Jen, et al., "High Efficiency High Reliability SiC MOSFET with Monolithically Integrated Schottky Rectifier", Proceedings of The 29th International Symposium on Power Semiconductor Devices & ICs, Sapporo, Japan, May 28-Jun. 1, 2017, pp. 45-48.

(Continued)

*Primary Examiner* — Kyoung Lee
(74) *Attorney, Agent, or Firm* — Murphy, Bilak & Homiller, PLLC

(57) ABSTRACT

According to an embodiment of a semiconductor device, the device includes gate trenches formed in a SiC substrate and extending lengthwise in parallel in a first direction. Rows of source regions of a first conductivity type are formed in the SiC substrate and extend lengthwise in parallel in a second direction which is transverse to the first direction. Rows of body regions of a second conductivity type opposite the first conductivity type are formed in the SiC substrate below the rows of source regions. Rows of body contact regions of the second conductivity type are formed in the SiC substrate. The rows of body contact regions extend lengthwise in parallel in the second direction. First shielding regions of the second conductivity type are formed deeper in the SiC substrate than the rows of body regions.

25 Claims, 18 Drawing Sheets

(51) Int. Cl.
*H01L 21/265* (2006.01)
*H01L 29/423* (2006.01)
*H01L 29/66* (2006.01)
*H01L 27/088* (2006.01)

(52) U.S. Cl.
CPC ...... *H01L 29/1608* (2013.01); *H01L 29/4236* (2013.01); *H01L 29/66068* (2013.01)

(56) References Cited

U.S. PATENT DOCUMENTS

| | | |
|---|---|---|
| 7,582,922 B2 | 9/2009 | Werner |
| 7,700,971 B2 | 4/2010 | Ueno |
| 7,872,308 B2 | 1/2011 | Akiyama et al. |
| 7,989,882 B2 | 8/2011 | Zhang et al. |
| 8,252,645 B2 | 8/2012 | Hshieh |
| 8,431,470 B2 | 4/2013 | Lui et al. |
| 8,525,254 B2 | 9/2013 | Treu et al. |
| 8,637,922 B1 | 1/2014 | Siemieniec et al. |
| 8,653,589 B2 | 2/2014 | Hsieh |
| 9,093,522 B1 | 7/2015 | Zeng et al. |
| 9,136,372 B2 | 9/2015 | Miyahara et al. |
| 9,293,558 B2 | 3/2016 | Siemieniec et al. |
| 9,478,655 B2 | 10/2016 | Siemieniec et al. |
| 9,496,384 B2 | 11/2016 | Nakano |
| 9,577,073 B2 | 2/2017 | Esteve et al. |
| 9,837,527 B2 | 12/2017 | Siemieniec et al. |
| 10,211,306 B2 | 2/2019 | Siemieniec et al. |
| 10,304,953 B2 | 5/2019 | Aichinger et al. |
| 2003/0020134 A1 | 1/2003 | Werner et al. |
| 2006/0076617 A1 | 4/2006 | Shenoy et al. |
| 2006/0246650 A1 | 11/2006 | Williams et al. |
| 2006/0267085 A1 | 11/2006 | Matsuura |
| 2008/0121989 A1 | 5/2008 | Kocon et al. |
| 2008/0315250 A1 | 12/2008 | Onozawa |
| 2009/0146209 A1 | 6/2009 | Akiyama et al. |
| 2010/0308401 A1 | 12/2010 | Narazaki |
| 2012/0248530 A1* | 10/2012 | Lui .................... H01L 27/0629 257/334 |
| 2013/0168701 A1 | 7/2013 | Kiyosawa et al. |
| 2013/0313635 A1 | 11/2013 | Nakano |
| 2013/0341711 A1 | 12/2013 | Matsumoto et al. |
| 2014/0021484 A1 | 1/2014 | Siemieniec et al. |
| 2014/0145206 A1 | 5/2014 | Siemieniec et al. |
| 2014/0145258 A1 | 5/2014 | Lin |
| 2014/0167151 A1 | 6/2014 | Yen et al. |
| 2014/0210000 A1 | 7/2014 | Tokuda et al. |
| 2016/0260829 A1 | 9/2016 | Aichinger et al. |
| 2017/0236931 A1 | 8/2017 | Meiser et al. |
| 2017/0345905 A1 | 11/2017 | Siemieniec et al. |
| 2018/0277637 A1 | 9/2018 | Meiser et al. |
| 2019/0109227 A1 | 4/2019 | Kobayashi et al. |
| 2019/0259842 A1 | 8/2019 | Basler et al. |

FOREIGN PATENT DOCUMENTS

| | | |
|---|---|---|
| DE | 102012211221 A1 | 1/2013 |
| DE | 102013214196 A1 | 1/2014 |
| DE | 102014117780 A1 | 6/2016 |
| DE | 102017108738 A1 | 10/2018 |
| DE | 102017128633 A1 | 6/2019 |
| DE | 102018103973 A1 | 8/2019 |
| JP | 07240409 | 9/1995 |
| JP | 09260650 A | 10/1997 |
| JP | H11154748 A | 6/1999 |
| JP | 2000031484 A | 1/2000 |
| JP | 2000277734 A | 10/2000 |
| JP | 2007080971 A | 3/2007 |
| JP | 2007129259 A | 5/2007 |
| JP | 2007221012 A | 8/2007 |
| JP | 2008505480 A | 2/2008 |
| JP | 2008108824 A | 5/2008 |
| JP | 2008159916 A | 7/2008 |
| JP | 2009117593 A | 5/2009 |
| JP | 2009187966 A | 8/2009 |
| JP | 2010541288 A | 12/2010 |
| JP | 2012044167 A | 3/2012 |
| JP | 2012151470 A | 8/2012 |
| JP | 2013214661 A | 10/2013 |
| JP | 2014003191 A | 1/2014 |
| JP | 2014075582 A | 4/2014 |
| JP | 2014107571 A | 6/2014 |
| JP | 2014165348 A | 9/2014 |
| WO | 03010812 A1 | 2/2003 |
| WO | 03019623 A2 | 3/2003 |

OTHER PUBLICATIONS

Jiang, Huaping, et al., "SiC MOSFET with Built-in SBD for Reduction of Reverse Recovery Charge and Switching Loss in 10-kV Applications", Proceedings of the 29th International Symposium on Power Semiconductor Devices & ICs, Sapporo, Japan, May 28-Jun. 1, 2017, pp. 49-52.

Kawahara, Koutarou, et al., "6.5 kV Schottky-Barrier-Diode-Embedded SiC-MOSFET for Compact Full-Unipolar Module", Proceedings of The 29th International Symposium on Power Semiconductor Devices & ICs, Sapporo, Japan, May 28-Jun. 1, 2017, pp. 41-44.

"CMF20120D—Silicon Carbide Power MOSFET 1200V 80 mΩ: Z-Fet MOSFET N-Channel Enhancement Mode", CMF20120D Rev. A, Cree, Inc., 2012, pp. 1-13.

* cited by examiner

SIC TRENCH TRANSISTOR DEVICE AND METHODS OF MANUFACTURING THEREOF

BACKGROUND

SiC MOSFETs (metal-oxide-semiconductor field effect transistors) suffer from low electron mobility at the SiC—SiO$_2$ interface which is due to carbon-related interface defects resulting from thermal oxidation of SiC. Electron scattering at such charged point defects at the SiC—SiO$_2$ interface results in the mobility (e.g. 5-50 cm$^2$/Vs) typically only being a fraction of the bulk mobility (e.g. 800 cm$^2$/Vs). Also, a 4° off-axis tilt is typically present along the <11-20> crystal direction (parallel to the flat wafer). The 4° off-axis tilt is a consequence of the crystal growth and cannot be avoided. Because of this tilt the wafer surface does not perfectly coincide with the (0001) crystal c-plane, causing a rough surface and steps along the <11-20> direction. The off-axis cut is not only a problem for planar technologies such as lateral MOSFETs and DMOSFETs which have a MOS channel at the wafer surface, but also for trench MOSFET technologies. A vertically etched trench with arbitrary orientation in general has two side walls with different roughness, performance and reliability, making it difficult to use both side walls of the trench as a high-mobility MOS channel.

Another problem associated with SiC MOSFETs is that the high breakdown field of the SiC material (typically 2 MV/cm) can usually only be used if the gate dielectric is properly protected. The electric field in the gate dielectric may increase by a factor of 2.5 if the electric field in the SiC approaches the avalanche break down field of SiC (2.2 MV/cm). Accordingly, SiC MOSFETs are typically designed in a way so that the electric field in the gate dielectric is limited under all operating conditions. This is typically done by deep p-type implants which form a JFET (junction FET)-like structure below the gate trench. However, the cell design also impacts on-resistance (Ron×A or Ron). To achieve a low on-resistance (Ron×A or Ron) and good shielding of the gate dielectric, the cell design should maximize the active channel area while providing sufficient protection for the gate dielectric.

Thus, there is a need for a SiC-based power semiconductor device having a cell design which maximizes the active channel area while providing sufficient protection for the gate dielectric.

SUMMARY

According to an embodiment of a semiconductor device, the semiconductor device comprises: gate trenches formed in a SiC substrate and extending lengthwise in parallel in a first direction; rows of source regions of a first conductivity type formed in the SiC substrate and extending lengthwise in parallel in a second direction which is transverse to the first direction; rows of body regions of a second conductivity type opposite the first conductivity type formed in the SiC substrate below the rows of source regions; rows of body contact regions of the second conductivity type formed in the SiC substrate, the rows of body contact regions extending lengthwise in parallel in the second direction; and first shielding regions of the second conductivity type formed deeper in the SiC substrate than the rows of body regions.

In some embodiments, the second direction may be transverse but not orthogonal to the first direction.

In some embodiments, the first shielding regions may be formed directly below the body contact regions and/or may extend lengthwise in parallel in the second direction. The rows of body contact regions may interleave with the rows of source regions and/or may be arranged next to the rows of source regions. The first shielding regions may provide a shielding of a gate dielectric of the gate trenches from a high electric field, which may occur in the semiconductor device, for example, at avalanche break down.

In a plane horizontal to a main surface of the SiC substrate, each of the source regions may be shaped as a parallelogram having a first pair of opposite angles which is defined by the first and second directions and greater than 90 degrees and a second pair of opposite angles which is defined by the first and second directions and less than 90 degrees.

Separately or in combination, each first pair of opposite angles defined by the first and second directions may be approximately 135 degrees and each second pair of opposite angles defined by the first and second directions may be approximately 45 degrees. In addition, or as an alternative, the first direction and the second direction may enclose an angle of approximately 45 degrees.

Separately or in combination, sections of the body regions disposed along sidewalls of the gate trenches may form channel regions of the semiconductor device. Opposing sidewalls of the same gate trench may be aligned with the (11-20) a-face of the SiC substrate so that the channel regions extend along the (11-20) a-face. As an alternative, opposing sidewalls of the same gate trench may be aligned with at least one of the (1-100) and the (−1100) plane of the SiC substrate. In this case, the channel regions extend along at least one of the (1-100) and the (−1100) plane. It may be further possible that only one sidewall of the same gate trench is aligned with the (11-20) a-face or with one of the (1-100) and the (−1100) plane. In this case, only one of the channel regions is aligned along the (11-20) a-face or one of the (1-100) and the (−1100) plane.

Separately or in combination, the semiconductor device may further comprise second shielding regions of the second conductivity type formed in the SiC substrate at the bottom of at least some of the gate trenches, wherein the second shielding regions are electrically contacted through adjoining ones of the first shielding regions and/or adjoining ones of the body contact regions. The second shielding regions together with the first shielding regions may provide a three-dimensional shielding of a gate dielectric of the gate trench.

Separately or in combination, the second shielding regions may extend to a different depth in the SiC substrate than the first shielding regions. For example, the second shielding regions may be positioned deeper in the SiC substrate than the first shielding regions.

Separately or in combination, the second shielding regions may be formed as stripes which extend lengthwise in parallel in the first direction. In general, a "stripe-shaped region" may have an extension in a lengthwise direction, which may be larger (e.g. at least 10 times larger) than an extension of the stripe orthogonal to the lengthwise direction.

According to an embodiment of a method of manufacturing a semiconductor device, the method comprises: forming gate trenches in a SiC substrate and extending lengthwise in parallel in a first direction; forming rows of source regions of a first conductivity type in the SiC substrate and extending lengthwise in parallel in a second direction which is transverse to the first direction; forming rows of body regions of a second conductivity type opposite the first conductivity type in the SiC substrate below the rows of source regions; forming rows of body contact regions of the second conductivity type in the SiC substrate, the rows of body contact regions extending lengthwise in parallel in the second direction; and forming first shielding regions of the second conductivity type deeper in the SiC substrate than the rows of body regions. In some embodiments of the method, the second direction may be transverse but not orthogonal to the first direction.

The method may further comprise: forming second shielding regions of the second conductivity type in the SiC substrate at the bottom of at least some of the gate trenches; and electrically contacting the second shielding regions through adjoining ones of the first shielding regions and/or adjoining ones of the body contact regions.

Separately or in combination, forming the second shielding regions may comprise: implanting a dopant species of the second conductivity type into the SiC substrate through the bottom of at least some of the trenches; and annealing the SiC substrate to activate the implanted dopant species. The dopant species may be implanted before forming a gate dielectric in the trenches.

Separately or in combination, the first shielding regions may be formed before forming the gate trenches.

According to an embodiment of a semiconductor device, the semiconductor device comprises: gate trenches formed in a SiC substrate and extending lengthwise in parallel in a first direction; rows of source regions of a first conductivity type formed in the SiC substrate and extending lengthwise in parallel in a second direction which is transverse to the first direction; rows of body regions of a second conductivity type opposite the first conductivity type formed in the SiC substrate below the rows of source regions; rows of body contact regions of the second conductivity type formed in the SiC substrate, the rows of body contact regions extending lengthwise in parallel in the second direction; first shielding regions of the second conductivity type formed deeper in the SiC substrate than the rows of body regions; and second shielding regions of the second conductivity type formed in the SiC substrate at the bottom of at least some of the gate trenches. The second shielding regions are electrically contacted through adjoining ones of the first shielding regions and/or adjoining ones of the body contact regions. In one, some or all embodiments, the second direction may be transverse but not orthogonal to the first direction.

According to an embodiment of a method of manufacturing a semiconductor device, the method comprises: forming gate trenches in a SiC substrate and extending lengthwise in parallel in a first direction; forming rows of source regions of a first conductivity type in the SiC substrate and extending lengthwise in parallel in a second direction which is transverse to the first direction; forming rows of body regions of a second conductivity type opposite the first conductivity type in the SiC substrate below the rows of source regions; forming rows of body contact regions of the second conductivity type in the SiC substrate, the rows of body contact regions extending lengthwise in parallel in the second direction; forming first shielding regions of the second conductivity type deeper in the SiC substrate than the rows of body regions; forming second shielding regions of the second conductivity type in the SiC substrate at the bottom of at least some of the gate trenches; wherein at least one of the first shielding regions, the second shielding regions and the body contact regions are formed and/or arranged such that the second shielding regions are electrically contacted through adjoining ones of the first shielding regions and/or adjoining ones of the body contact regions.

In one, some or all embodiments of the semiconductor device and/or the method described herein, at least one of the following features applies, alone or in combination:

The first shielding region and/or the second shielding region may have a higher doping concentration than the body region.

The first direction and the second direction may enclose an angle in a range of 1° to 89°. In addition or as an alternative, the enclosed angle may be not equal to (0°±k·90°), with k being a natural number including zero.

The first direction and the second direction enclose an angle of at least 20° and at most 70°, or at least 30° and at most 60°.

The first direction and the second direction enclose an angle of 90°. In other words: in some embodiments, the first direction may be orthogonal to the second direction.

The second shielding regions may extend along the first direction.

At least some of the second shielding regions may extend along at least 90% of the corresponding gate trench or even along the entire gate trench.

Opposing sidewalls of the same gate trench may be aligned with either the (11-20) a-plane or at least one of the (1-100) and the (−1100) plane of the SiC substrate. For example, the channel regions extend along the (11-20) a-plane or at least one of the (1-100) and the (−1100) plane, respectively.

Both opposing sidewalls of the gate trench may be aligned along the same crystal plane and/or opposing channel regions may extend along the same crystal plane.

Those skilled in the art will recognize additional features and advantages upon reading the following detailed description, and upon viewing the accompanying drawings. Features described in connection with certain embodiments of a semiconductor device and/or a method described herein may, mutatis mutandis, also be applicable to other embodiments of a semiconductor device and/or a method described herein.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

The embodiments described herein may provide a SiC trench transistor device with a new cell design, smaller pitch size and/or reduced number of layers. In some embodiments, the SiC transistor device cell design has first shielding regions and rows of source regions which extend lengthwise in parallel in a direction which is transverse to the lengthwise direction of the gate trenches so as to maximize the active channel area while protecting the gate dielectric from high breakdown fields within the SiC material. In other embodiments, the SiC transistor device cell design also has second shielding regions at the bottom of at least some of the gate trenches for enhancing the gate dielectric protection, wherein electrical contact is made to the second shielding regions through adjoining ones of the first shielding regions and/or adjoining body contact regions. The rows of source regions extend lengthwise in parallel in a direction which is transverse to the lengthwise extension direction of the gate trenches, but the lengthwise extension direction of the rows of source regions may or may not be orthogonal to the lengthwise extension direction of the gate trenches according to these embodiments. The embodiments described herein may be combined so that the SiC transistor device cell design may have the first and second shielding regions and the rows of source regions may extend lengthwise in parallel in a direction which is transverse to the lengthwise direction of the gate trenches. In one or more or all of the embodiments, the second direction may be transverse but not orthogonal to the first direction. In one or more or all of the embodiments, device channels on both sides of the gate trenches may have a (11-20) crystal orientation.

Figure 1:
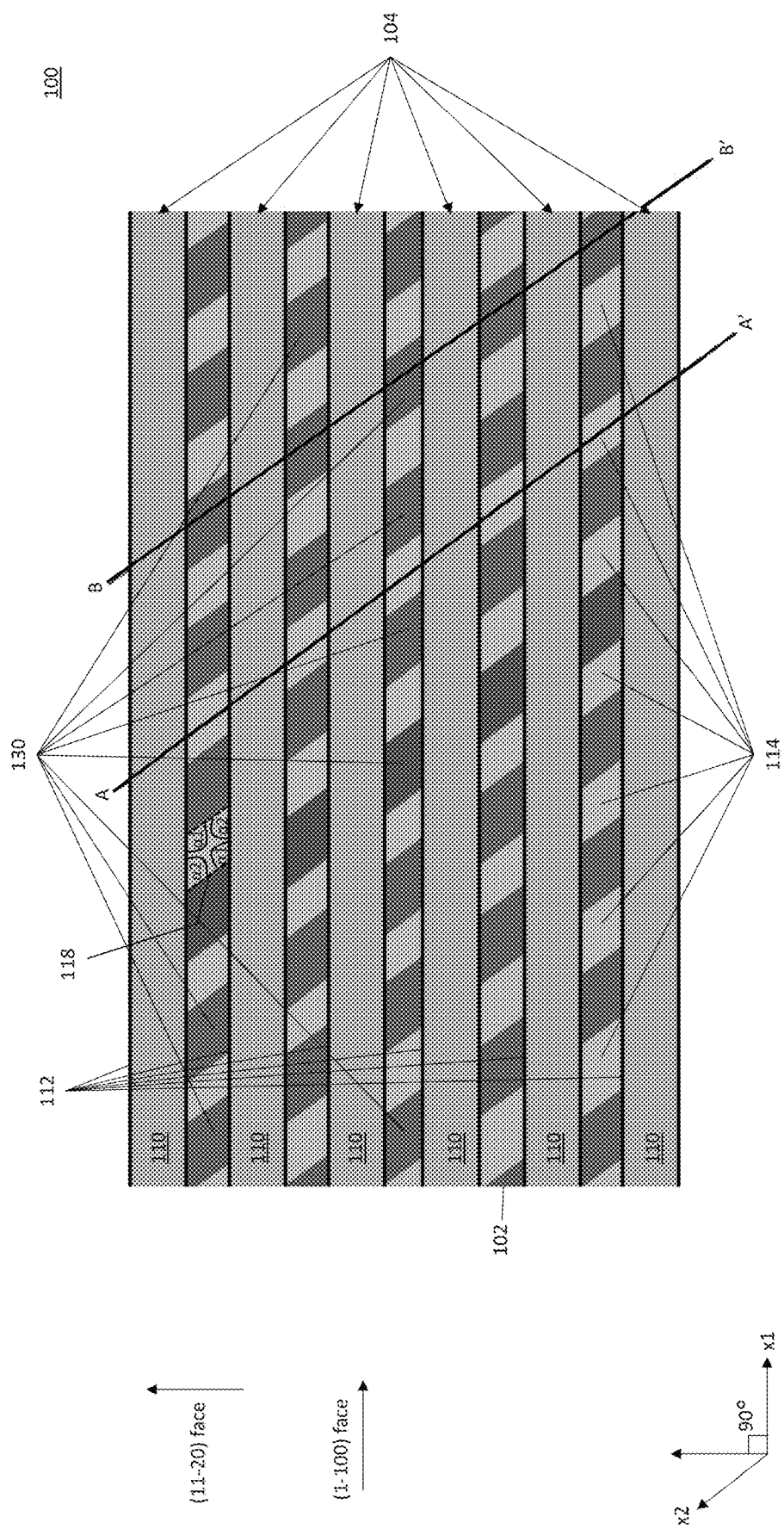
FIG. 1 illustrates a partial top plan view of an embodiment of a semiconductor device having first shielding regions formed in a SiC material.
Figure 2:
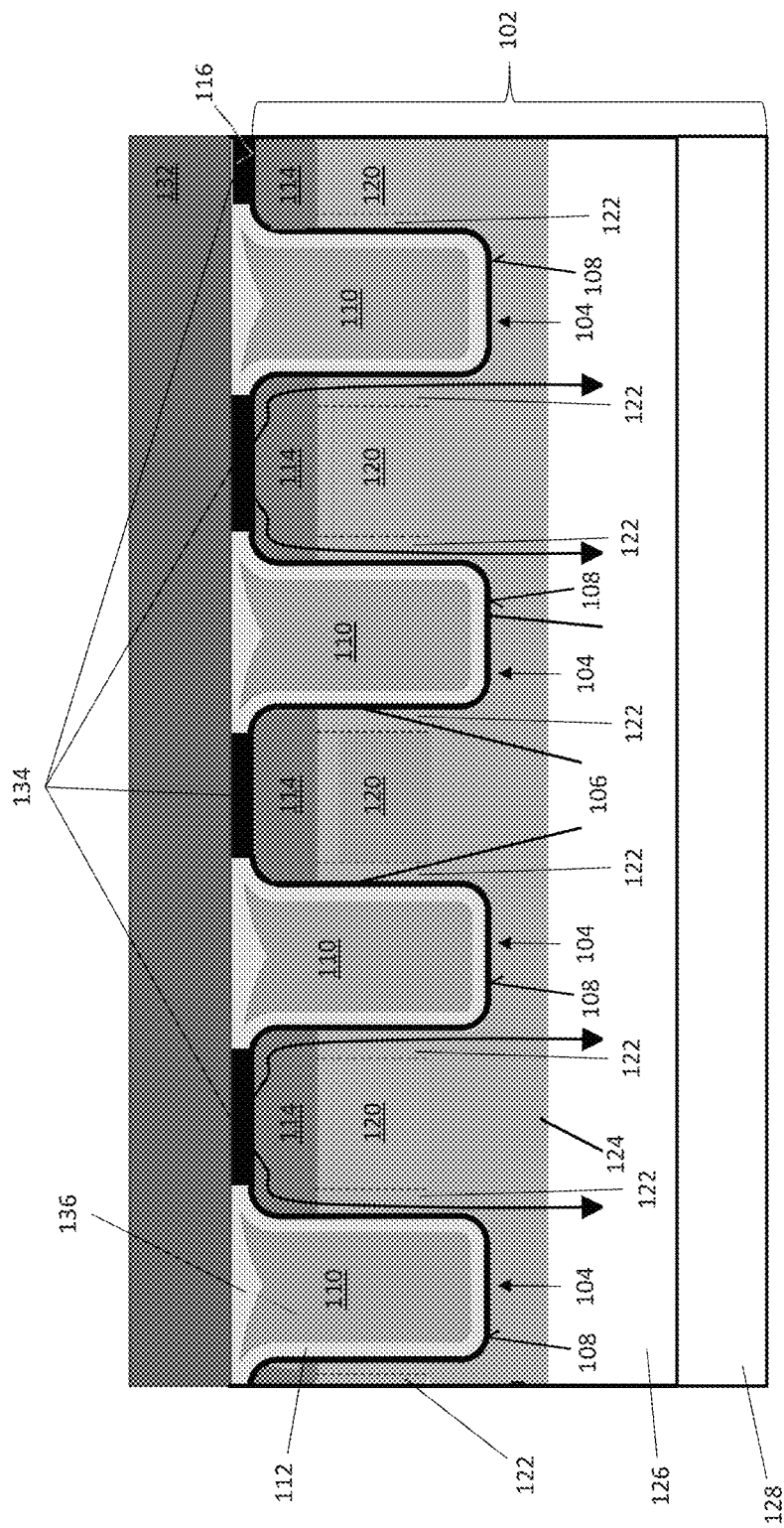
FIG. 2 illustrates a cross-sectional view of the semiconductor device along the line labelled A-A' in FIG. 1.
Figure 3:
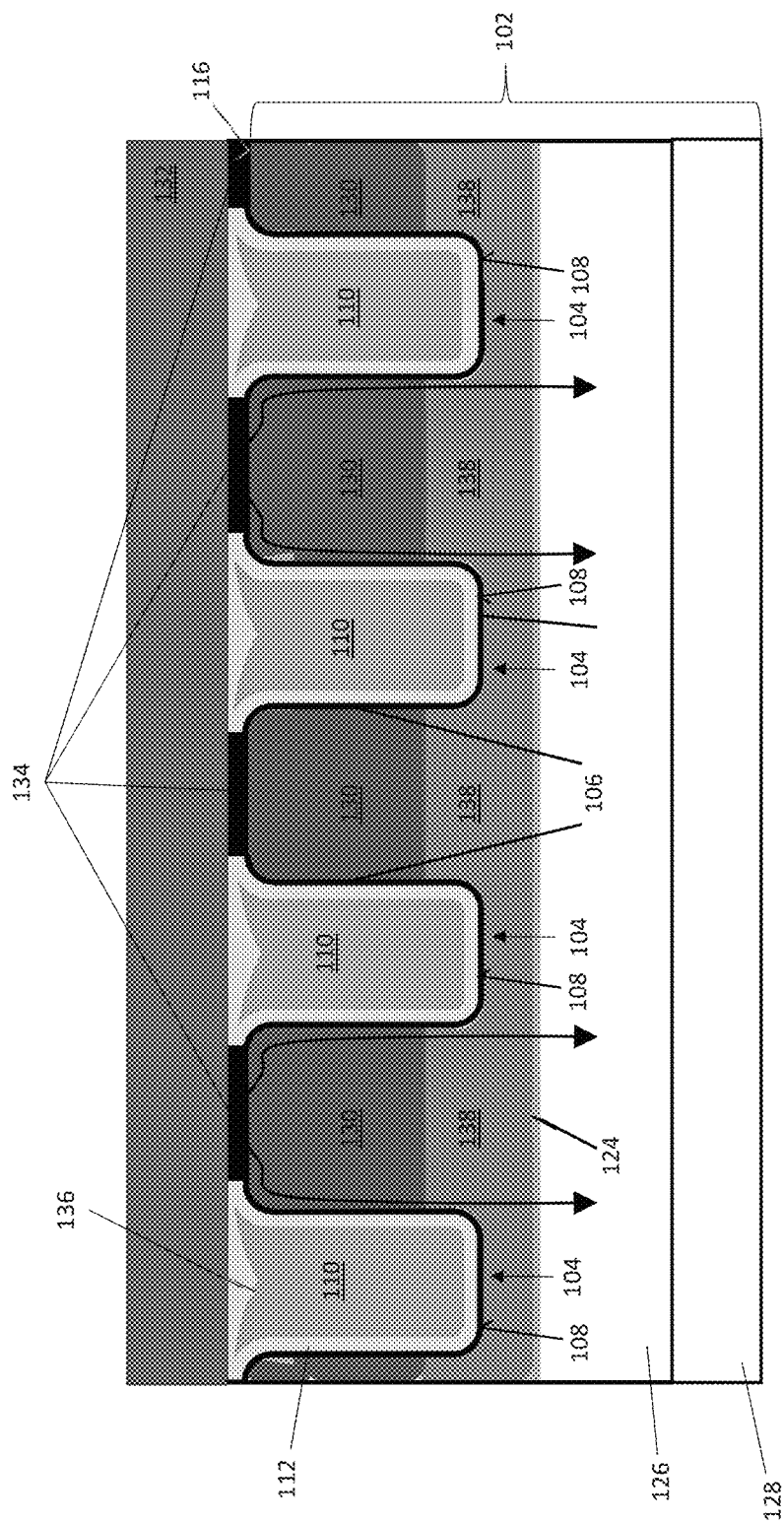
FIG. 3 illustrates a cross-sectional view of the semiconductor device along the line labelled B-B' in FIG. 1.

FIG. 1 illustrates a partial top plan view of an embodiment of a semiconductor device 100. FIG. 2 illustrates a cross-sectional view of the semiconductor device 100 along the line labelled A-A' in FIG. 1. FIG. 3 illustrates a cross-sectional view of the semiconductor device 100 along the line labelled B-B' in FIG. 1. The semiconductor device 100 may be a power semiconductor device such as a power MOSFET, for example.

The semiconductor device 100 includes a SiC substrate 102. The SiC substrate 102 may include one or more SiC epitaxial layers grown on a SiC wafer (e.g. a singulated part of a SiC ingot). The SiC wafer may be removed from the SiC substrate 102 after epitaxial growth. In the case of an n-channel power MOSFET, the SiC substrate 102 may have n-type background doping. In the case of a p-channel power MOSFET, the SiC substrate 102 may have p-type background doping. In either case, the semiconductor device 100 also includes gate trenches 104 formed in the SiC substrate 102 and which extend lengthwise in parallel in a first direction x1. Each gate trench 104 has opposing sidewalls 106 and a bottom 108. In one embodiment, the opposing sidewalls 106 of each gate trench 104 are aligned with the (11-20) a-face of the SiC substrate 100. In other embodiments, the opposing sidewalls 106 of each gate trench 104 may be aligned with at least one of the (1-100) and the (-1100) plane of the SiC substrate 100.

A gate electrode 110 is disposed in each gate trench 104. A field electrode (not shown) may also be disposed in the gate trenches 104, below and electrically insulated from the gate electrodes 110. In one embodiment, the gate electrodes 110 and optional field electrodes are formed from doped polysilicon such as p+ polysilicon. The gate electrodes 110 are insulated from the SiC substrate 102 by a gate dielectric 112.

Rows of source (or emitter) regions 114 of a first conductivity type are formed in the SiC substrate 102 and extend lengthwise in parallel in a second direction x2 which is transverse but not orthogonal to the first direction x1. However, in other embodiments, the second direction x2 may be transverse to the first direction x1. The term 'transverse' as used herein with respect to the second direction x2 means acting, lying, or being across the first direction x1. The term 'not orthogonal' as used herein with respect to the second direction x2 means not intersecting the first direction x1 at a right angle, i.e., not intersecting the first direction x1 at 90 degrees. In one embodiment, in a plane horizontal to the main surface 116 of the SiC substrate 102, each of the source regions 114 is shaped as a parallelogram 118 between adjacent gate trenches 104 and has a first pair of opposite angles α1 which is defined by the first and second directions x1, x2 and greater than 90 degrees and a second pair of opposite angles α2 which is defined by the first and second directions x1, x2 and less than 90 degrees. In a particular embodiment, each first pair of opposite angles defined by the first and second directions x1, x2 is approximately 135 degrees (α1=135°) and each second pair of opposite angles defined by the first and second directions x1, x2 is approximately 45 degrees (α2=45°). Other transverse but not orthogonal complimentary pairs of angles α1, α2 may be realized.

Rows of body regions 120 of a second conductivity type opposite the first conductivity type are formed in the SiC substrate 102 below the rows of source regions 114. The rows of body regions 120 may extend lengthwise in parallel in the same second direction x2 as the rows of source regions 114. A channel region 122 of the second conductivity type in each body region 120 is disposed adjacent each sidewall 106 of the corresponding gate trench. In an embodiment, the opposing sidewalls 106 of each gate trench 104 are aligned with the (11-20) a-face of the SiC substrate 102 so that the channel regions 122 extend along the (11-20) a-face. According to this embodiment, the opposing sidewalls 106 of the same gate trench 104 have approximately the same roughness, performance and reliability. In other embodiments, the channel regions 122 may extend along at least one of the (1-100) and the (-1100) plane.

Signals applied to the gate electrodes 110 control the conductive state of the channel regions 122, thereby controlling current flow (illustrated by downward facing arrows) between the source regions 114 and an underlying current distribution layer 124 of the first conductivity type formed in the SiC substrate 102. A drift zone 126 of the first conductivity type is formed in the SiC substrate 102 below the current distribution layer 124, and a drain (or collector) region 128 of the semiconductor device is disposed below the drift zone 126. The terms "source" and "emitter" are used interchangeably herein as are the terms "drain" and "collector", to indicate that the semiconductor device 100 may be a MOSFET, IGBT (insulated gate bipolar transistor), JFET or similar type of transistor device.

Rows of body contact regions 130 of the second conductivity type are formed in the SiC substrate 102 and may be interleaved with the rows of source regions 114. The rows of body contact regions 130 extend lengthwise in parallel in the second direction x2. The body contact regions 130 provide a low ohmic connection between an overlying source metal layer 132 and the underlying body regions 120, e.g., through conductive contacts 134 which extend from the source metal layer 132 to the body contact regions 130 through an interlayer dielectric 136. The source metal layer 132 is not shown in FIG. 1 for ease of illustration. The source regions 114 of the semiconductor device 100 are also in ohmic connection with the source metal layer 132, e.g., through conductive contacts 134 which extend from the source metal layer 132 to the source regions 114 through the interlayer dielectric 136.

The semiconductor device 100 further includes first shielding regions 138 of the second conductivity type formed deeper in the SiC substrate 102 than the rows of body regions 120. The first shielding regions 138 protect the gate dielectric 112 from high breakdown fields within the SiC material (typically 2 MV/cm). In the case of an n-channel power MOSFET, the body regions 120, channel regions 122, body contact regions 130 and first shielding regions 138 have p-type conductivity and the source regions 114, current distribution layer 124, drift zone 126 and drain region 128 have n-type conductivity. In the case of a p-channel power MOSFET, the body regions 120, channel regions 122, body contact regions 130 and first shielding regions 138 have n-type conductivity and the source regions 114, current distribution layer 124, drift zone 126 and drain region 128 have p-type conductivity.

The first shielding regions 138 may be electrically connected to the source metal layer 132, e.g., through conductive contacts 134 which extend from the source metal layer 132 to the body contact regions 130 through the interlayer dielectric 136. The interlayer dielectric 136 is not shown in FIG. 1, so as to provide an unobstructed view of other regions of the semiconductor device 100 disposed below the interlayer dielectric 136. The first shielding regions 130 included in the semiconductor device 100 may instead be electrically connected to a potential other than source potential.

When turning off the semiconductor device 100 via appropriate control of the signal applied to the gate electrodes 110, the first shielding regions 138 are at source (or other) potential suitable to build-up a positive voltage in the SiC substrate 102. The first shielding regions 138 and the drift zone 126 are of the opposite conductivity type, and a blocking voltage builds up between these oppositely doped parts of the SiC substrate 102. The first shielding regions 138 deplete all or most of the oppositely-doped SiC material near the bottom 108 of the gate trenches 104, protecting the gate dielectric 112 from excessive electric fields at the interfaces between the gate trenches 104 and the SiC material. That is, the first shielding regions 138 take up most or all of the electric field that builds up in the oppositely-doped SiC material during blocking operation of the semiconductor device 100. In wideband semiconductor devices such as SiC devices, the electric field that builds up in the wideband semiconductor material may be approximately at the same level as or even above the maximum allowed electric field for the gate dielectric 112. The first shielding regions 138 protect against overstressing of the gate dielectric 112, ensuring reliable operation. By orienting the lengthwise extension of the rows of source regions 114, the rows of body regions 120 and the rows of body contact regions 130 in a direction x2 which is transverse but not orthogonal to the direction x1 in which the rows of gate trenches 104 extend lengthwise in parallel, the first shielding regions 138 provide a shielding effect at the bottom 108 of the gate trenches 104 and therefore more robustly limit the maximum electric field which impinges upon the gate dielectric 112.

The implants used to form the body regions 120 and the first shielding regions 138 utilize thick hardmasks to block the respective high energy implantations. A slope angle of the hardmasks of e.g. 88° or higher may reduce the tail concentration of the implants. By reducing the tail of the body region and first shielding region implants, the impact on the channel regions 122 and therefore the gate source threshold voltage is also reduced. The striped cell configuration shown in FIG. 1 provides accurate control of the thick hardmask layer slope angle.

FIGS. 4A through 4K illustrate an embodiment of a method of manufacturing the semiconductor device 100 shown in FIGS. 1 through 3. Some of FIGS. 4A through 4K provide a spilt view of the semiconductor device 100 to better illustrate specific processing in certain regions of the device 100, with the left-hand view depicting a first shielding region part of the semiconductor device 100 along the line labelled B-B' in FIG. 1 and the right-hand view depicting a source region part of the device 100 along the line labelled A-A' in FIG. 1.

Figure 4A:
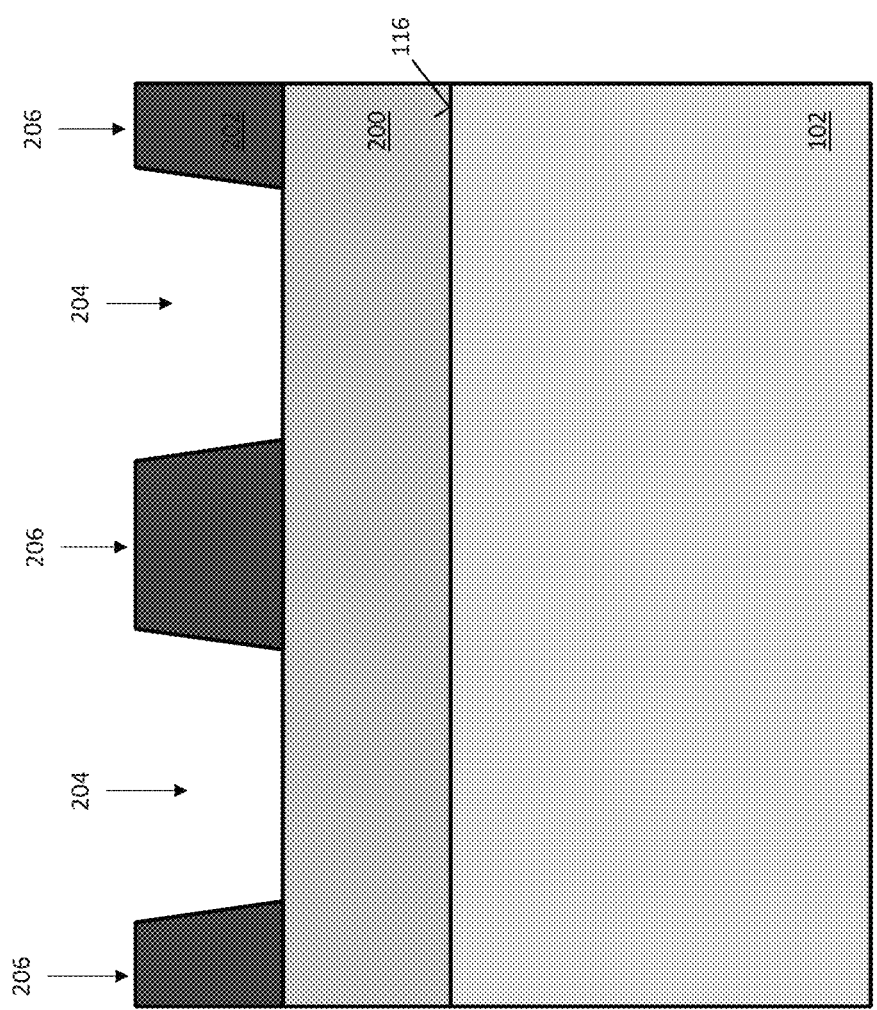
FIGS. 4A through 4K illustrate respective partial cross-sectional views of the semiconductor device shown in FIGS. 1 through 3, during different stages of manufacturing.

FIG. 4A shows the SiC substrate 102 after a first hardmask 200 such as an oxide hardmask like undoped silicon oxide glass (USG) is formed on the main surface 116 of the SiC substrate 102 and a photoresist 202 is formed on the first hardmask 200. The photoresist 202 is patterned to define rows or stripes 204 for implanting the dopants used to form the first shielding regions 138. Corresponding rows/stripes 206 of the photoresist 202 which remain intact define the location of the rows of source regions 114 to be formed.

Figure 4B:
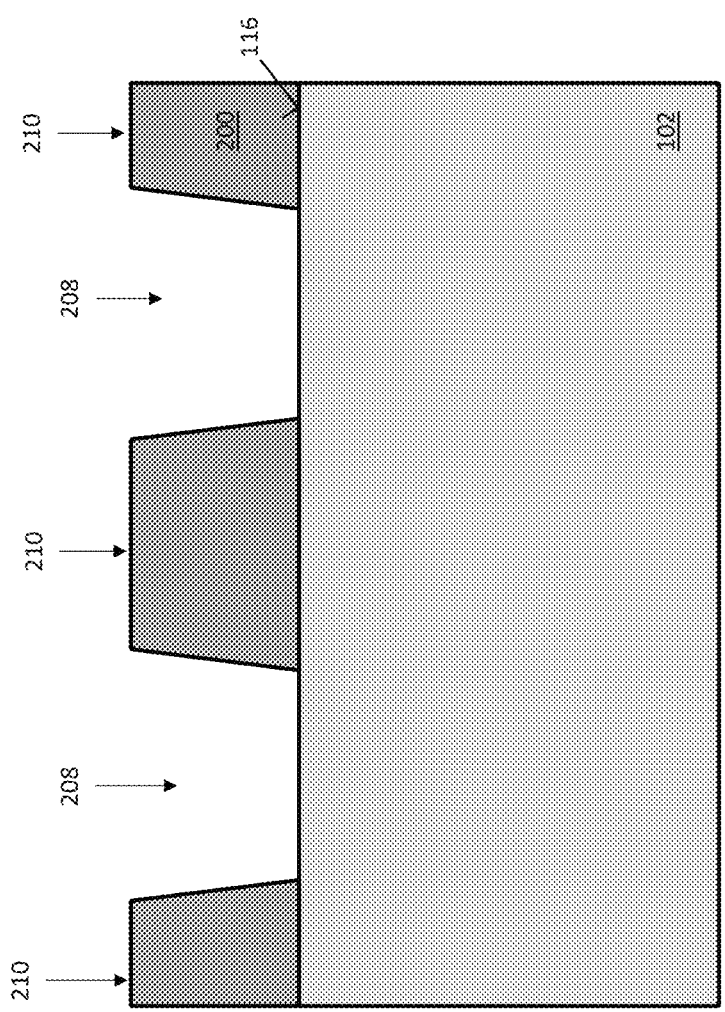

FIG. 4B shows the SiC substrate 102 after the first hardmask 200 is patterned using the photoresist 202 and after the photomask 202 is removed. The pattern 204/206 of the photoresist 202 is transferred to the first hardmask 200, e.g., using a typical hardmask etching process, to define first rows/stripes 208 for implanting the dopants used to form the first shielding regions 138. The first hardmask 200 remains unetched where covered by the photoresist 202, so that the underlying part of the SiC substrate 102 protected by the corresponding rows/stripes 210 of remaining first hardmask 200 are not implanted with the dopants used to form the first shielding regions 138. The etched and unetched stripes 208, 210 of the first hardmask 200 may be interleaved and extend lengthwise in parallel with one another along the direction labelled 'x2' in FIG. 1.

Figure 4C:
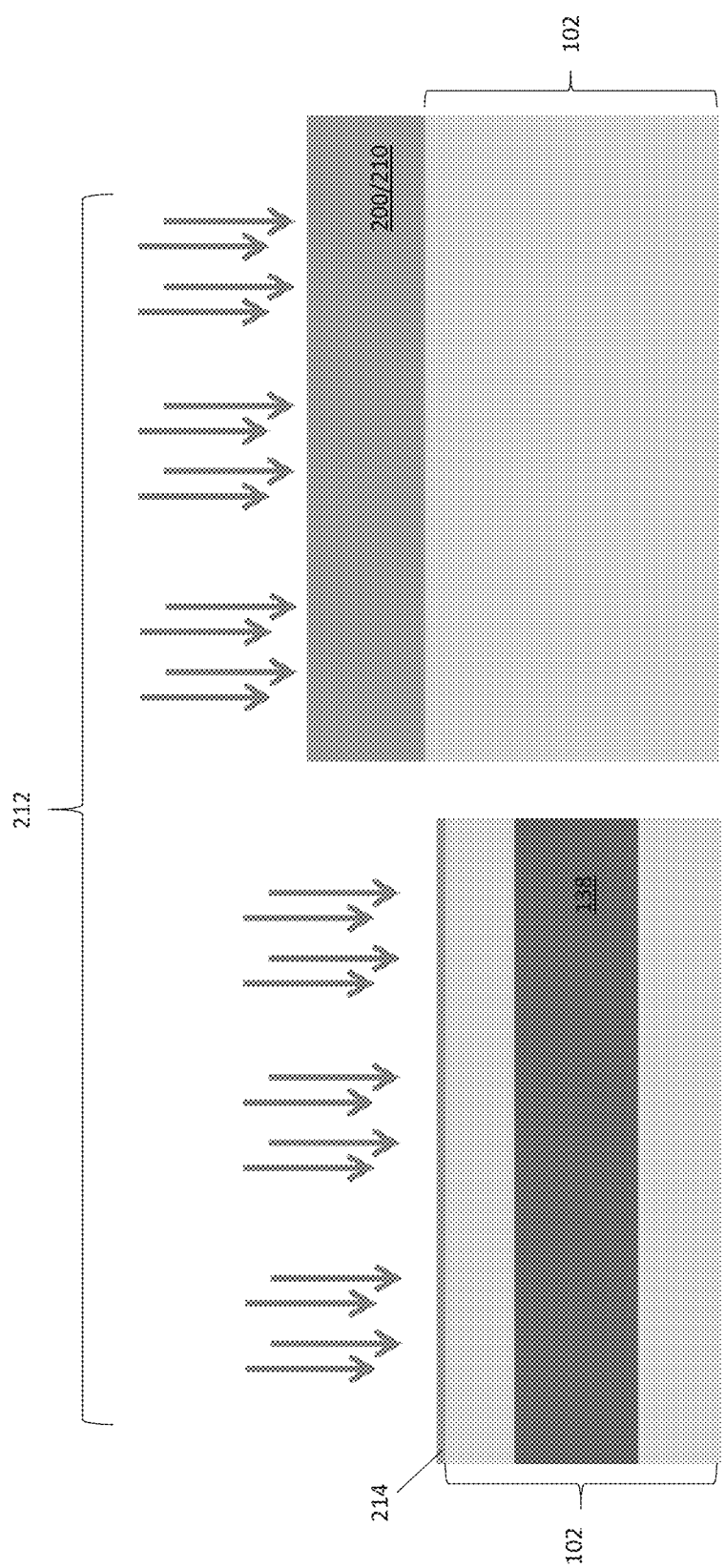

FIG. 4C shows the SiC substrate 102 during implantation of a dopant species 212 of the second conductivity type into the first rows/stripes 208 of the SiC substrate 102 unprotected by the first hardmask 200, to form the first shielding regions 138. A relatively high-energy implant e.g. of about 1700 keV or more or less may be used to form the first shielding regions 138 deep enough in the SiC substrate 102, so that the first shielding regions 138 extend to a depth of the gate trenches 104 or even deeper in the SiC substrate 102. In the case of an n-channel device, typical p-type dopant species 212 for SiC include beryllium, boron, aluminium, and gallium. In the case of a p-channel device, typical n-type dopant species 212 for SiC include nitrogen and phosphorus. Other types of dopant species 212 may be used to form the first shielding regions 138. A thin oxide layer 214 such as about 40 nm thick tetraethyl orthosilicate (TEOS) may be deposited on the first rows/stripes 208 of the SiC substrate 102 unprotected by the first hardmask 200 to aid the ion implantation process. Few or no dopant species 212 of the second conductivity type are implanted into the part of the SiC substrate 102 protected by the first hardmask 200.

Figure 4D:
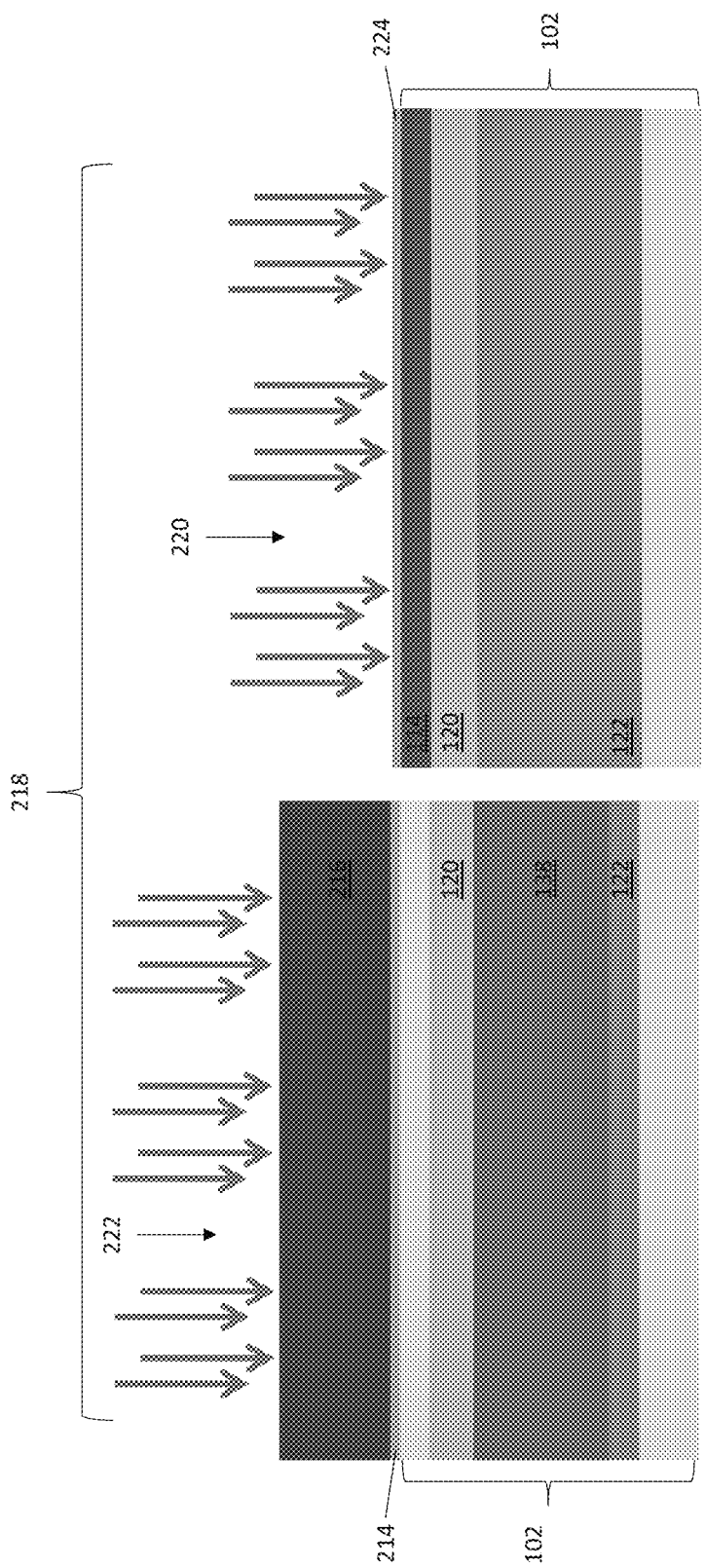

FIG. 4D shows the SiC substrate 102 after the first hardmask 200 is removed, after the body regions 120 of the second conductivity type and the current distribution layer 122 of the first conductivity type are implanted over the entire SiC substrate 102 except, e.g., in a border (edge) region of the SiC substrate 102 which is out of view, after a second patterned hardmask 216 such as an oxide hardmask like USG is formed on the main surface 116 of the SiC substrate 102, and after dopants 218 of the first conductivity type are implanted into second rows/stripes 220 of the SiC substrate 102 unprotected by the second hardmask 216. The implant dose of the current distribution layer 122 is lower than the implant dose of the body regions 120, and therefore the body regions 120 are only slightly affected by the implantation of the oppositely-doped current distribution layer 122.

The second hardmask 216 is patterned similar to the first hardmask 200 used to implant the first shielding regions 138, but instead exposes the part of the SiC substrate 102 in which the rows of source regions 114 are to be formed and covers the part of the SiC substrate 102 into which the first shielding regions 138 were previously implanted. The etched and unetched stripes 220, 222 of the second hardmask extend 216 lengthwise in parallel with one another along the direction labelled 'x2' in FIG. 1, but may be interleaved in the opposite manner as the etched and unetched stripes 208, 210 of the first hardmask 200 used to implant the first shielding regions 138, so that the part of the SiC substrate 102 in which the rows of source regions 114 are to be formed remain unprotected by the second hardmask 216.

Similar to the first shielding region implantation process, a thin oxide layer 224 such as about 40 nm thick TEOS may be deposited on the second rows/stripes 220 of the SiC substrate 102 unprotected by the second hardmask 216 to aid the source region ion implantation process. Few or no dopant species 218 of the first conductivity type are implanted into the part of the SiC substrate 102 protected by the second hardmask 216. In the case of an n-channel device, typical n-type dopant species 218 for SiC include nitrogen and phosphorus. In the case of a p-channel device, typical p-type dopant species 218 for SiC include beryllium, boron, aluminium, and gallium. Other types of dopant species 218 may be used to form the rows of source regions.

Figure 4E:
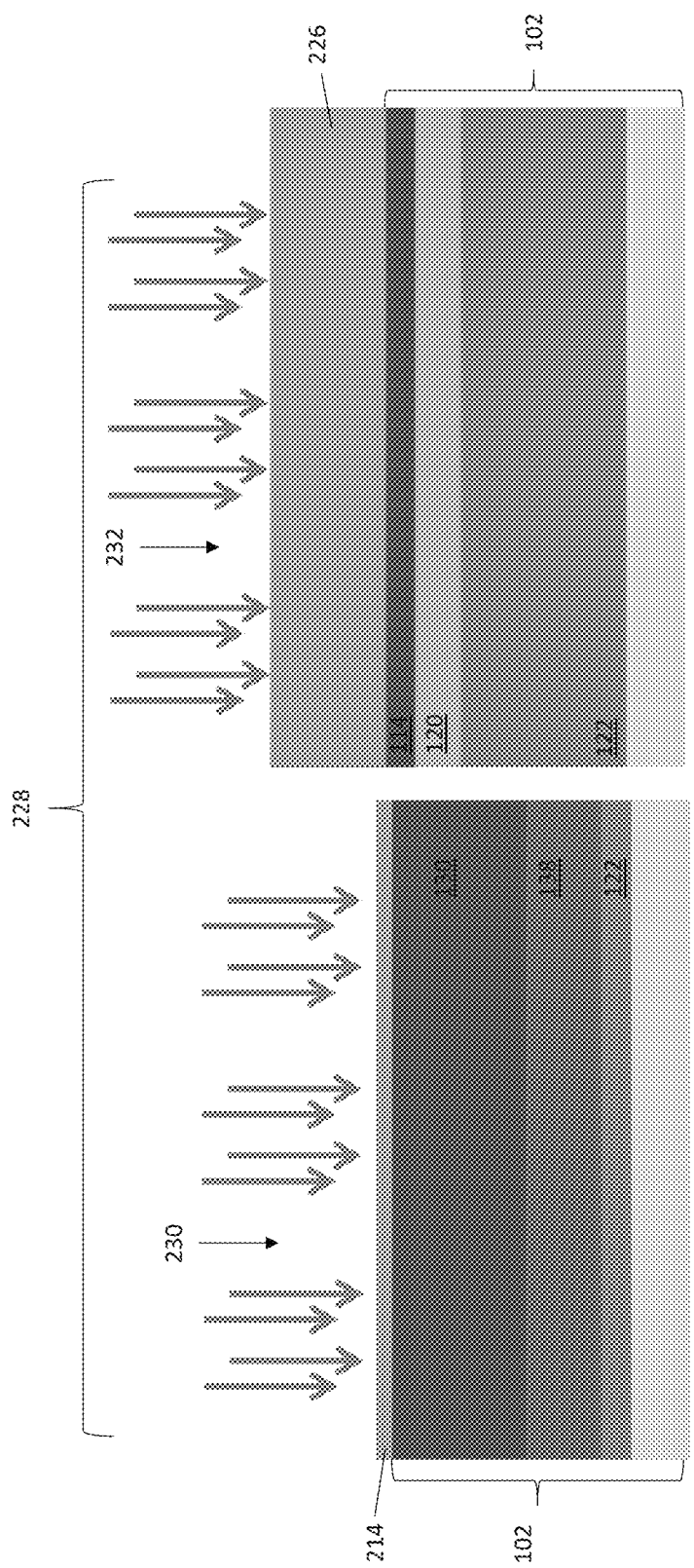

FIG. 4E shows the SiC substrate 102 after the second hardmask 216 is removed, after a third hardmask 226 such as an oxide hardmask like USG is formed over the part of the SiC substrate 102 with the implanted rows of source regions 114, and during implantation of dopant species 228 of the second conductivity into the part of the SiC substrate 102 unprotected by the third hardmask 226 to form the rows of body contact regions 130. The etched and unetched stripes 230, 232 of the third hardmask 226 extend lengthwise in parallel with one another along the direction labelled 'x2' in FIG. 1 and may be interleaved in the same manner as the etched and unetched stripes 208, 210 of the first hardmask 200 used to implant the first shielding regions 138, so that the part of the SiC substrate 102 in which the rows of body contact regions 130 are to be formed remain unprotected by the third hardmask 226. Few or no dopant species 228 of the second conductivity type are implanted into the rows of source regions 114 during the body contact implantation process, due to the presence of the third hardmask 226.

Figure 4F:
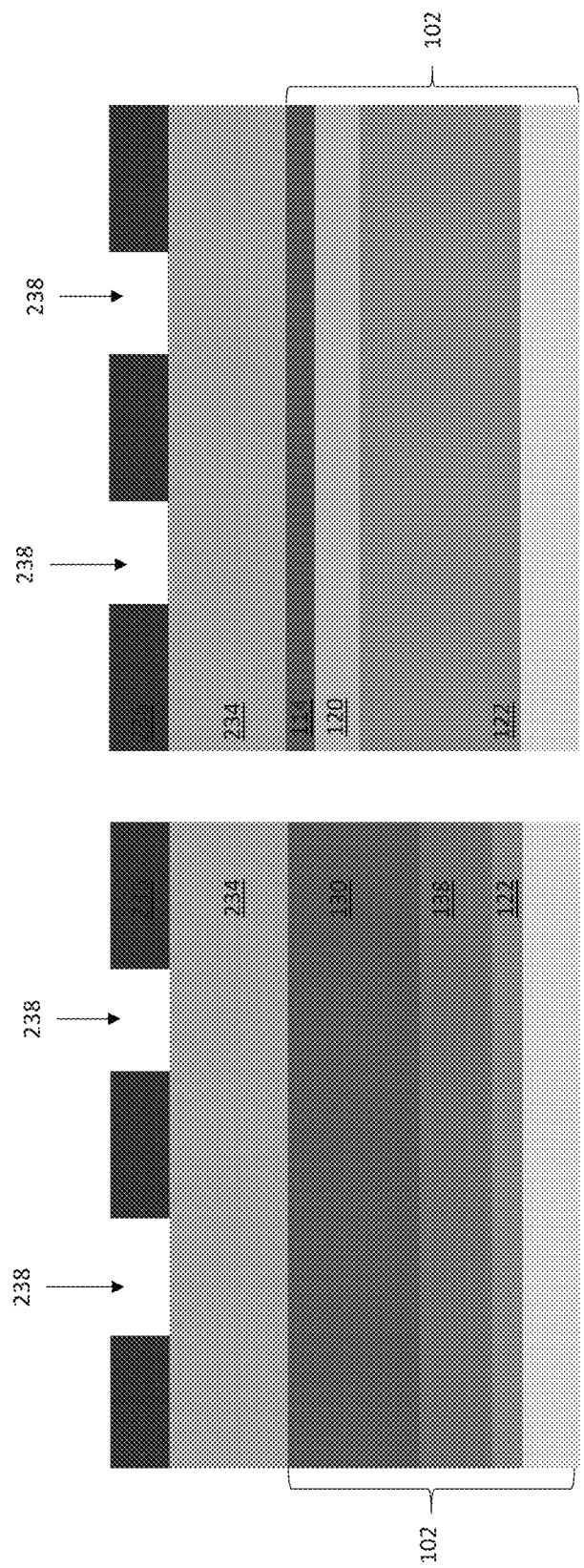

FIG. 4F shows the semiconductor device after the third hardmask 226 is removed, after a fourth hardmask 234 such as an oxide hardmask like USG is formed on the main surface 116 of the SiC substrate 102, and after a photoresist 236 is formed on the fourth hardmask 234. The photoresist 236 is patterned to define regions 238 for forming the rows of gate trenches 104 in the SiC substrate 102. The rows 238 of removed photoresist 236 define the profile of the gate trenches 104, and extend lengthwise in parallel with one another along the direction labelled 'x1' in FIG. 1.

Figure 4G:
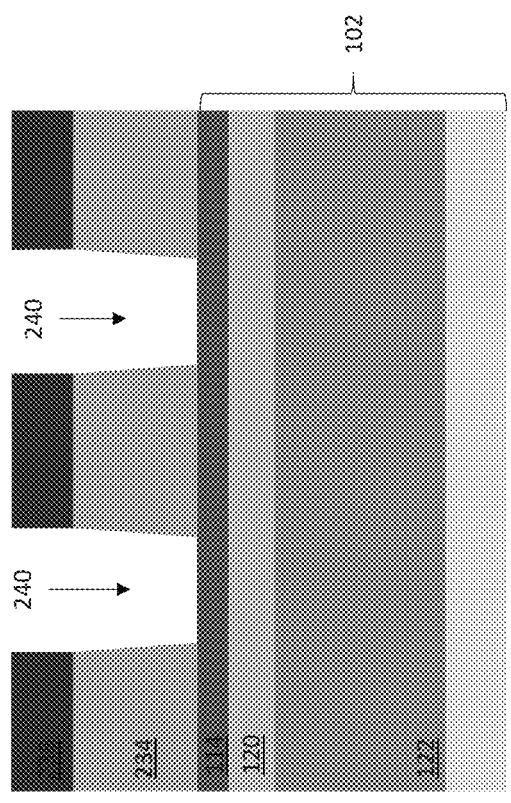
Figure 4G:
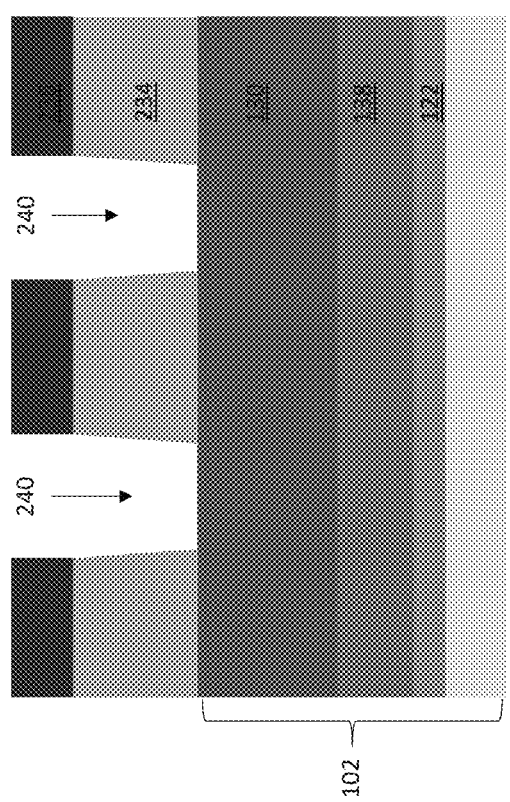

FIG. 4G shows the SiC substrate 102 after the pattern 238 of the photoresist 236 is transferred to the fourth hardmask 234, e.g., using a typical hardmask etching process. The remaining part of the fourth hardmask 234 is patterned in rows/stripes 240 which extend lengthwise in parallel with one another along the direction labelled 'x1' in FIG. 1.

Figure 4H:
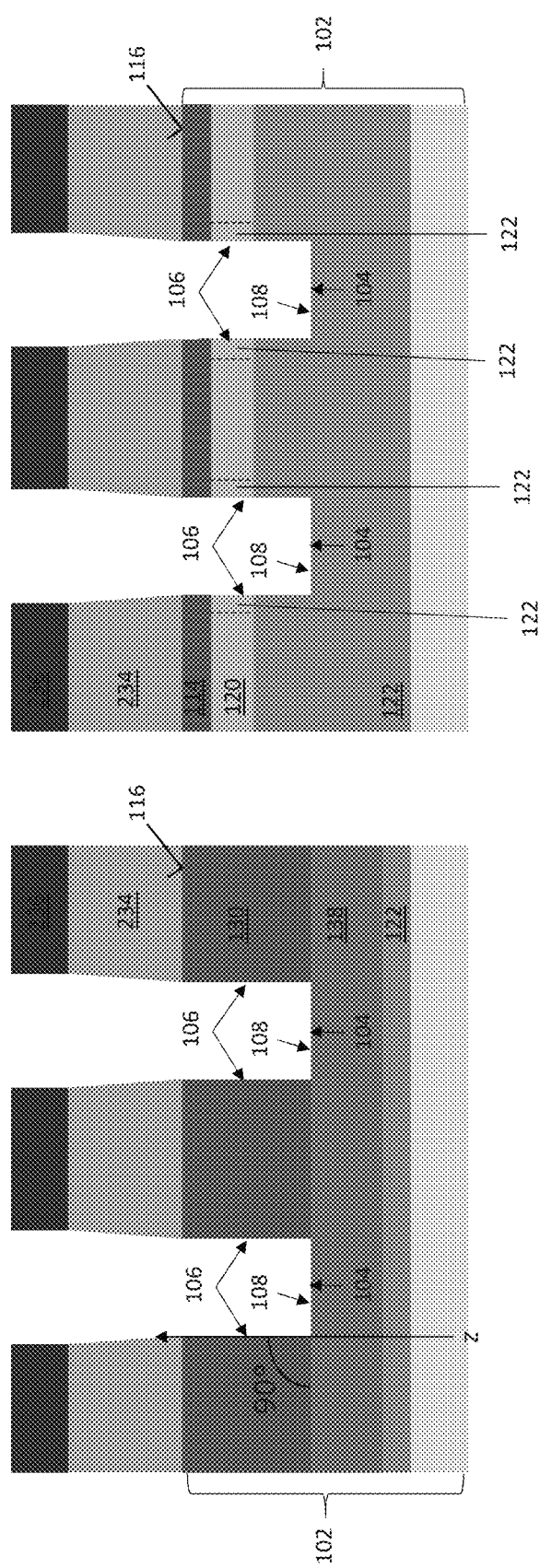

FIG. 4H shows the SiC substrate 102 after the rows of gate trenches 104 are etched into the part 240 of the SiC substrate 102 unprotected by the patterned fourth hardmask 234, e.g., using a typical SiC trench etching process. In the case of USG as the fourth hardmask 234, the selectivity of SiC to USG is about 1:1. The gate trenches 104 are etched along the same direction as the SiC substrate off-axis tilt, and two channel regions 122 are provided per one source region 122—one channel region 122 each along facing sidewalls 106 of adjacent gate trenches 104. The rows of gate trenches 104 etched into the SiC substrate 102 intersect the rows of source regions 114 and the rows of body contact regions 130 at an angle different than 90 degrees i.e. in a transverse but non-orthogonal manner. For example, alternating rows/stripes of source and body regions 114, 130 may be disposed at a 45° angle with respect to the lengthwise extension of the rows of gate trenches 104. The angle of the alternating rows/stripes of source and body regions 114, 130 may be in a range of 1° to 89° with respect to the lengthwise extension of the rows of gate trenches 104. In one embodiment, opposing sidewalls 106 of the gate trenches 104 are aligned with the (11-20) a-face of the SiC substrate 102 so that the channel regions 122 extend along the (11-20) a-face. The gate trench sidewalls 106 extend in a vertical direction z at an angle of approximately 90 degrees with respect to the main surface 116 of the SiC substrate 102. In each case, the first shielding regions 138, which may extend deeper in the SiC substrate 102 than the gate trenches 104, do not laterally extend beyond the corners of the active source regions 114.

Figure 4I:
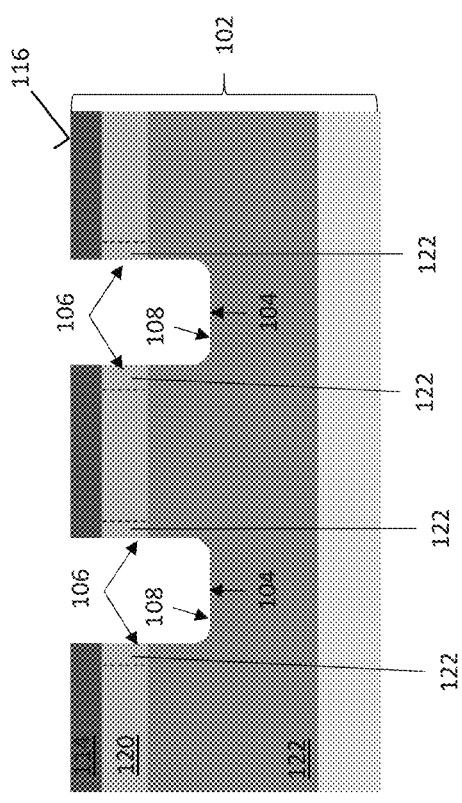
Figure 4I:
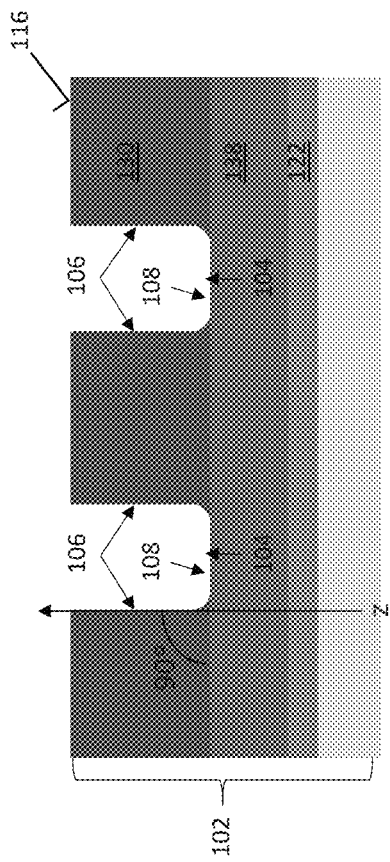

FIG. 4I shows the SiC substrate 102 after removal of the fourth hardmask 234 and corresponding photoresist 236, and after an $H_2$ treatment process, e.g., for about 6 min at about 1520° C. The $H_2$ treatment process rounds the bottom corners of the gate trenches 104, helping to reduce the electric field in this part of the device. An optional further process (e.g. an $H_2$ treatment) may be used to round the top corners of the gate trenches 104, where the sidewalls 106 of the gate trenches 104 merge with the main surface 116.

In the embodiment shown in FIGS. 4A to 4I, the gate trenches 104 are formed after forming the first shielding regions 138. It may thus not be required to protect the gate trench 104 by an additional mask during forming the first shielding regions 138. Furthermore, if the top corners of the gate trenches 104 are rounded, exact vertical implantation of the dopant species 212 of the second conductivity type may be hindered or even prevented. In general, the stability and/or accuracy of the implantation processes (e.g. forming the first shielding regions 138) before the introduction of the gate trench 104 may depend on the planarity of the surface through which the implantation is performed. Therefore, introducing the gate trenches 104 prior to the implantation processes could decrease the stability and/or the accuracy of the implantation.

Figure 4J:
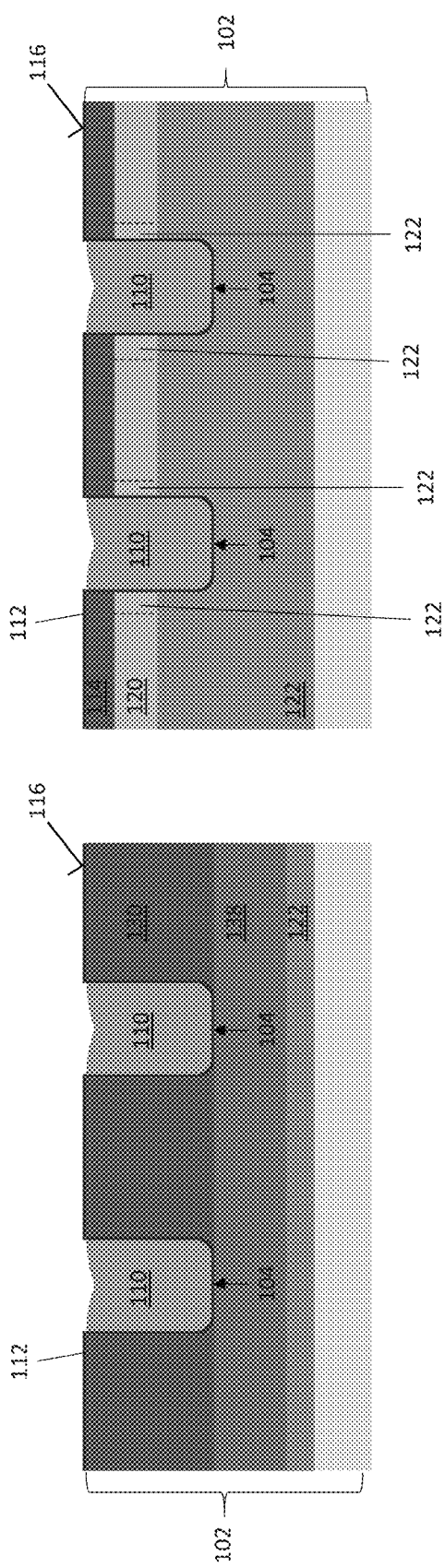

FIG. 4J shows the SiC substrate 102 after a gate dielectric 112 is formed on the sidewalls 106 and bottom 108 of the gate trenches 104, e.g., by TEOS and post-oxidation in nitrous oxide, and after the gate trenches 104 are filled with an electrically conductive material such as polysilicon or metal and recessed, e.g. by dry etching, to form the gate electrodes 110 in the gate trenches 104.

Figure 4K:
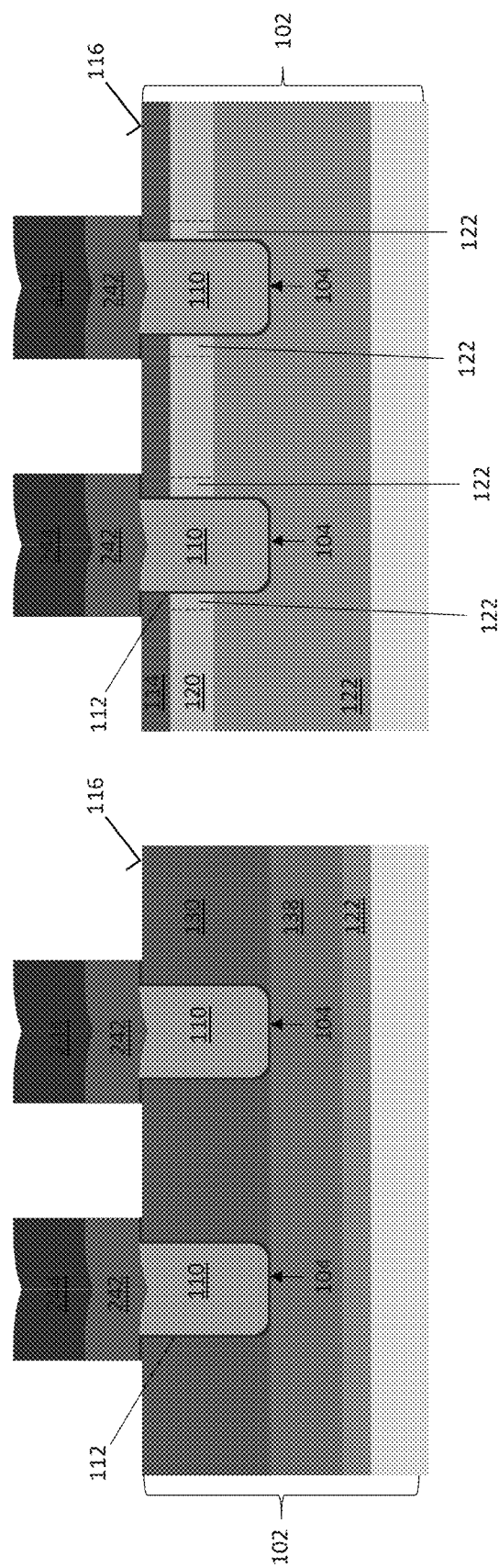

FIG. 4K shows the SiC substrate 102 after a patterned oxide 242 such as TEOS and a patterned gate conductor 244 such as metal is formed over the gate electrodes 110. The patterned gate conductor 244 is electrically connected to the gate electrodes 110 by electrically conductive vias which extend through the patterned oxide 242 and are out of view in FIG. 4K.

The semiconductor device 100 manufactured according to the method illustrated in FIGS. 4A through 4K has a cell pitch which may be further reduced due to the use of separated highly doped source and body contact regions 114, 120 of the opposite conductivity type which are arranged in a three-dimensional design. Also, since it might not be required to align the gate trenches 104 to the first shielding regions 138, in particular a contact region of the first shielding regions 138, a step that is conventionally important may be omitted. Thus, the fabrication method may have less overlay tolerance and less process complexity. The gate trench etching angle is less critical, and the trench etching process affects both sidewalls 106 of the gate trenches 104 in the same way, ensuring symmetric cell operation and offering the same performance and reliability along both trench sidewalls 106 by aligning the opposing sidewalls 106 e.g. along the (11-20) a-face of the SiC substrate 102. Step bunching due to off-axis cut may occur only perpendicular to the gate trench rows/stripes, so that no uncontrolled step bunching occurs along the length of the gate trenches 104. The first shielding regions 138 of the semiconductor device 100 provide multi-dimensional blocking capability and more flexibility in managing the trade-off between low on-resistance (Ron) and avalanche robustness. The method illustrated in FIGS. 4A through 4K also yields a semiconductor device 100 with a flat surface topography.

Figure 5:
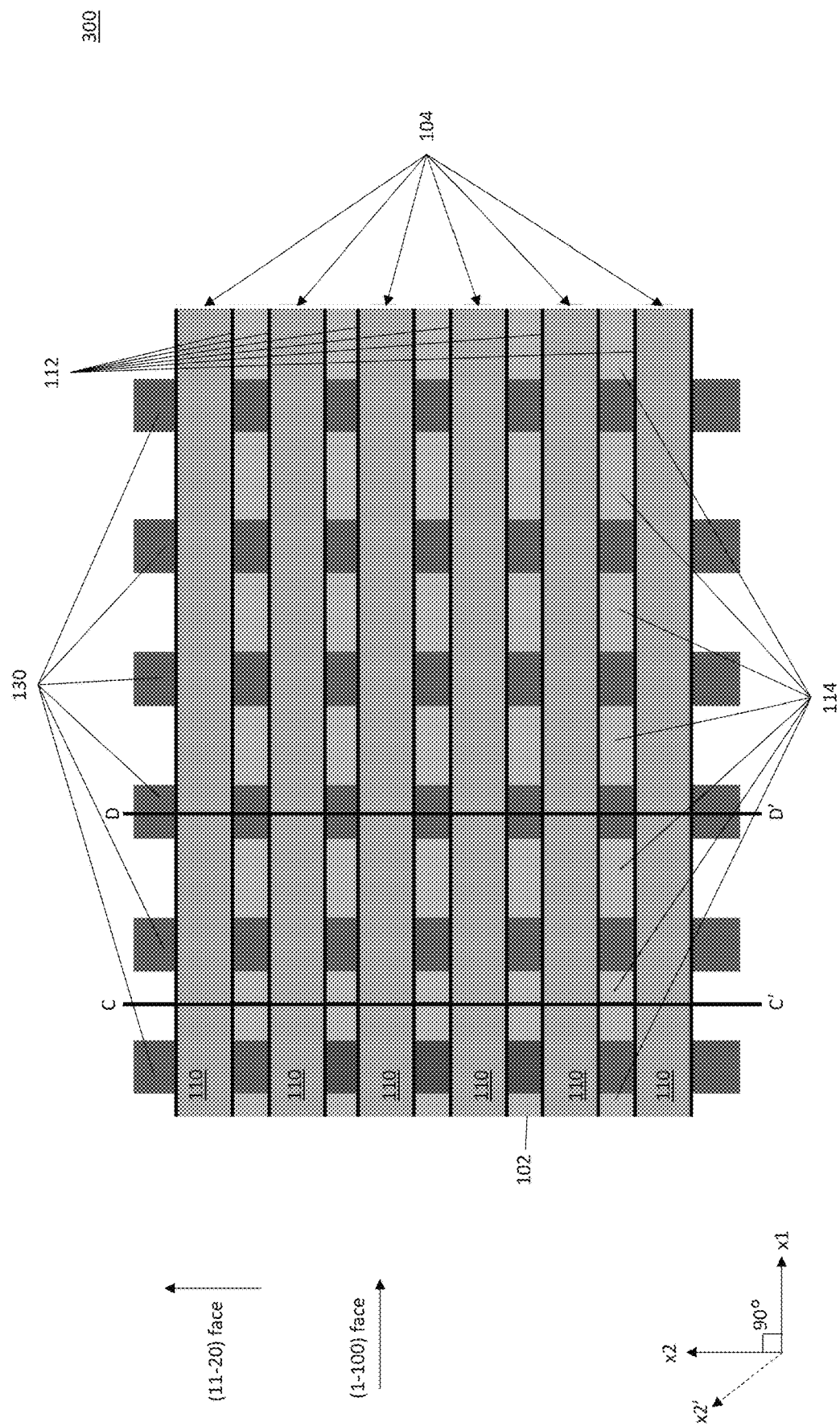
FIG. 5 illustrates a partial top plan view of an embodiment of a semiconductor device having first and second shielding regions formed in a SiC material.
Figure 6:
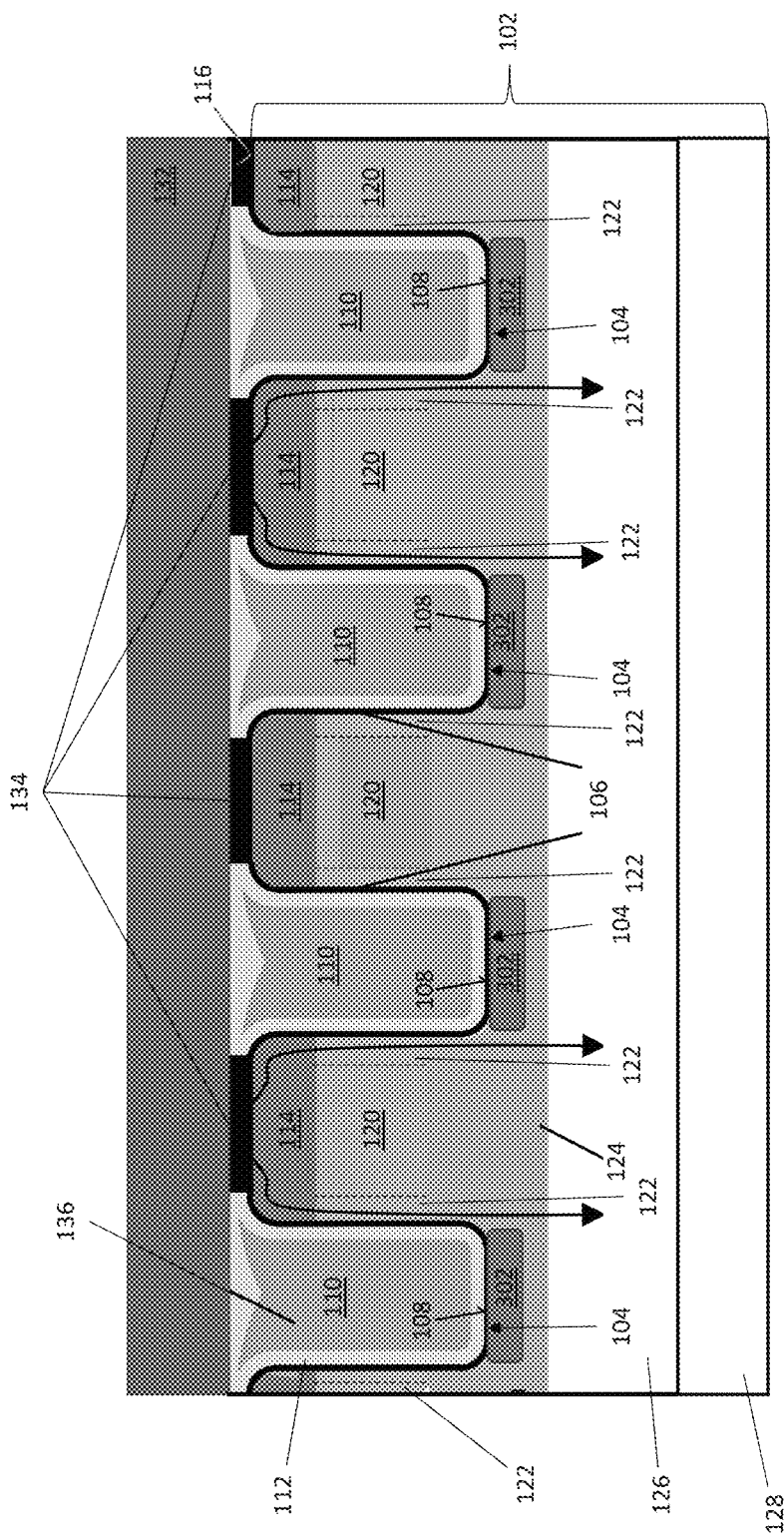
FIG. 6 illustrates a cross-sectional view of the semiconductor device along the line labelled C-C' in FIG. 5.
Figure 7:
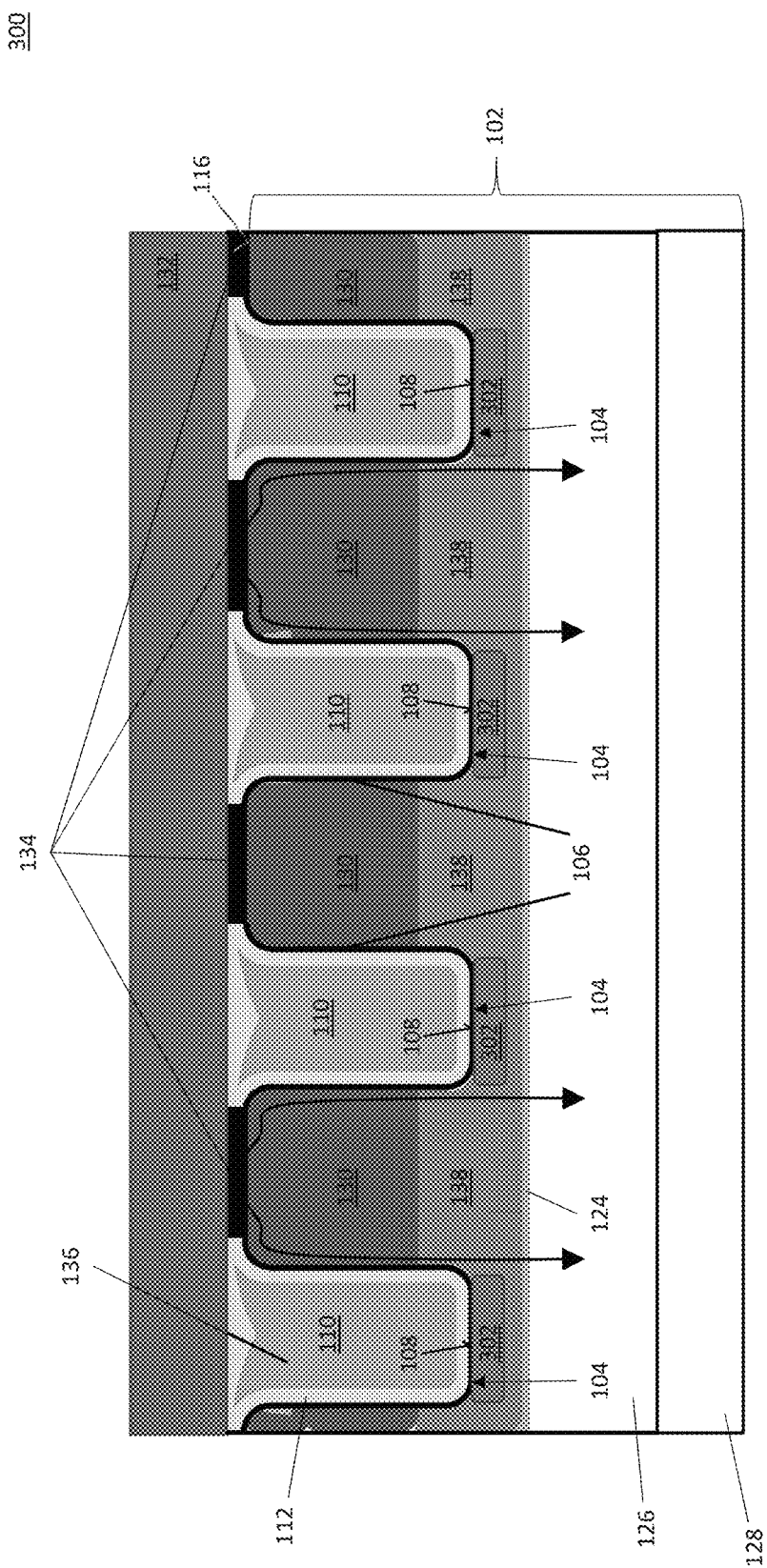
FIG. 7 illustrates a cross-sectional view of the semiconductor device along the line labelled D-D' in FIG. 5.

FIG. 5 illustrates a partial top plan view of another embodiment of a semiconductor device 300. FIG. 6 illustrates a cross-sectional view of the semiconductor device 300 along the line labelled C-C' in FIG. 5. FIG. 7 illustrates a cross-sectional view of the semiconductor device 300 along the line labelled D-D' in FIG. 5. The semiconductor device 300 may be a power semiconductor device such as a power MOSFET.

The semiconductor device 300 shown in FIGS. 5 through 7 is similar to the semiconductor device 100 shown in FIGS. 1 through 3. Different, however, the semiconductor device 300 shown in FIGS. 5 through 7 also includes second shielding regions 302 of the second conductivity type formed in the SiC substrate 102 at the bottom 108 of at least some of the gate trenches 104. The first and second shielding regions 138, 302 collectively provide three-dimensional shielding of the gate dielectric 112 from high breakdown fields within the SiC material, allowing for more flexibility in the design of the shielding grid provided by the first and second shielding regions 138, 302 and for improved tradeoff between Ron and electric field strength as well as avalanche robustness. The first shielding regions 138 of the semiconductor device 300 shown in FIGS. 5 through 7 may run transverse and/or orthogonal to the second shielding regions 302.

Electrical contact is made to the second shielding regions 302 through adjoining ones of the first shielding regions 138 and/or adjoining ones of the body contact regions 130. In FIGS. 5 through 7, the first shielding regions 138 are shown adjoining the second shielding regions 302. However, the body contact regions 130 may extend deep enough into the SiC substrate 102 so that the second shielding regions 302 are adjoined by the body contact regions 130 and not the first shielding regions 138. In yet another embodiment, both the first shielding regions 138 and the body contact regions 130 adjoin the second shielding regions 302 to provide electrical contact. In each case, a high-dose implant of dopant species of the second conductivity type (e.g. p+ or p++ in the case of an n-channel device or n+ or n++ in the case of a p-channel device) is not required since the first shielding regions 138 and/or the body contact regions 130 provide direct electrical contact to the second shielding regions 302. As such, a separate metal or polysilicon trench or similar contact is not required to electrically contact the second shielding regions 302 and therefore a highly-doped region for providing low ohmic contact between the second shielding regions 302 and such a structure is not required.

The rows of source regions 114 and the rows of body contact regions 130 alternate and extend lengthwise in parallel with one another in a direction x2 which is transverse to the lengthwise extension direction x1 of the gate trenches 104. The second shielding regions 302 may be formed as rows/stripes which extend lengthwise in parallel in the same direction x2 as the rows of source and body contact regions 114, 130, or may have a non-stripe shape such as islands, for example. In either case, the lengthwise direction x2 of the rows of source and body contact regions 114, 130 may or may not be orthogonal to the lengthwise extension direction x1 of the gate trenches 104 according to this embodiment.

FIG. 5 shows the lengthwise direction x2 of the rows of source and body contact regions 114, 130 being orthogonal (at 90 degrees) to the lengthwise extension direction x1 of the gate trenches 104. However, the rows of source and body contact regions 114, 130 may instead extend lengthwise in parallel in a direction x2' which is transverse but not orthogonal to the lengthwise extension direction x1 of the gate trenches 104, e.g., as previously described herein in connection with the semiconductor device embodiment illustrated in FIGS. 1 through 3. For example, in a plane horizontal to the main surface 116 of the SiC substrate 102, each of the source regions 114 may be shaped as a parallelogram having a first pair of opposite angles which is defined by the different lengthwise extension directions x1, x2' and greater than 90 degrees and a second pair of opposite angles which is defined by the different lengthwise extension directions x1, x2' and less than 90 degrees. Each first pair of opposite angles defined by the different lengthwise extension directions x1, x2' may be approximately 135 degrees, and each second pair of opposite angles defined by the different lengthwise extension directions x1, x2' may be approximately 45 degrees. In combination or separately, opposing sidewalls 106 of the same gate trench 104 may be aligned with the (11-20) a-face (or at least one of the (1-100) plane and the (−1100) plane) of the SiC substrate 102 so that the channel regions 122 extend along the (11-20) a-face (or at least one of the (1-100) plane and the (−1100) plane), also as previously described herein in connection with the semiconductor device embodiment illustrated in FIGS. 1 through 3.

Figure 8:
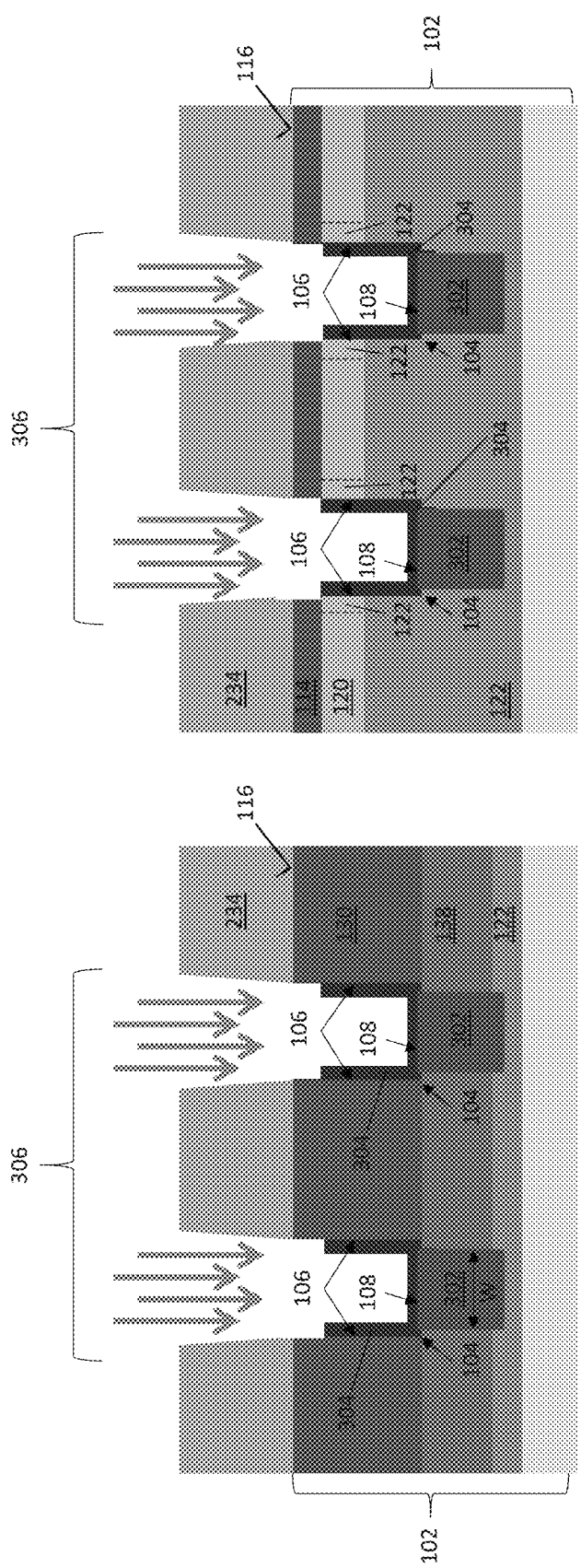
FIG. 8 illustrates a partial cross-sectional view of the semiconductor device shown in FIGS. 5 through 7, during formation of the second shielding regions.

FIG. 8 illustrates an embodiment of a method of manufacturing the semiconductor device 300 shown in FIGS. 5 through 7. FIG. 8 provides a split view of the semiconductor device 300 to better illustrate specific processing in certain regions of the device 300, with the left-hand view depicting the first shielding region part of the semiconductor device 300 along the line labelled C-C' in FIG. 5 and the right-hand view depicting the source region part of the device 300 along the line labelled D-D' in FIG. 5. Since most of the processing is the same or similar for the semiconductor devices 100, 300 illustrated in FIGS. 1 through 3 and FIGS. 5 through 7, only the processing associated with forming the second shielding regions 302 is illustrated in FIG. 8.

FIG. 8 shows the SiC substrate 102 after the rows of gate trenches 104 have been etched into the SiC substrate 102, after a sacrificial oxide 304 such as an oxide hardmask like USG is formed on the sidewalls 106 and bottom 108 of the gate trenches 104, and during implantation of the second shielding regions 302. The SiC substrate 102 may be processed up to this point in accordance with FIGS. 4A through 4H, for example. The second shielding regions 302 are formed by implanting a dopant species 306 of the second conductivity type into the SiC substrate 102 through the bottom 108 of at least some of the gate trenches 104. The SiC substrate 102 is subsequently annealed to activate all implanted dopants.

The second shielding regions 302 may extend to a different depth in the SiC substrate 102 than the first shielding regions 138. For example, the second shielding regions 302 may extend deeper into the current spreading layer 122 than the first shielding regions 138. In each case, a high-dose implant of dopant species of the second conductivity type (e.g. p+ or p++ in the case of an n-channel device or n+ or n++ in the case of a p-channel device) is not required since the first shielding regions 138 and/or the body contact regions 130 provide direct electrical contact to the second shielding regions 302, as previously described herein.

The second shielding regions 302 may be formed as stripes which extend lengthwise in parallel in the same direction (e.g. x2 or x2' in FIG. 5) as the rows of source and body contact regions 114, 130. The second shielding regions 302 may instead have another shape, e.g., the second shielding regions 132 may be shaped as islands at the bottom 108 of some or all of the gate trenches 104. The dimensions and number of openings in the hardmask 234 determine which gate trench bottoms 108 are implanted with the dopant species 306 of the second conductivity type and the shape of the resulting implanted second shielding regions 302.

The second shielding region 302 may be realized by a single short implant, or by combining one or more high energy implantations for a deep profile with one or more lower energy implantations to adjust the shallow doping close to the trench bottom 108. The sacrificial oxide 304 protects the trench sidewalls 106 during the second shielding region implant to minimize the impact on channel region doping. The thickness of the sacrificial oxide 304 may be adjusted based on the implant energy and may vary for implants with different energy, to optimize trench sidewall protection. The thickness of the sacrificial oxide 304 may also be selected to shape the width (W) of the doping well beneath the gate trenches 104 where the second shielding regions 302 are formed, thus adjusting the shielding effect provided by the second shielding regions 302.

The sacrificial oxide 304 is removed and processing of the SiC substrate 102 continues, e.g. as previously described herein in connection with FIGS. 4I through 4K. The second shielding regions 302 may be implanted in the SiC substrate 102 before or after the $H_2$ treatment process shown in FIG. 4I but before the gate dielectric 112 is formed on the sidewalls 106 and bottom 108 of the gate trenches 104.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
   gate trenches formed in a SiC substrate and extending lengthwise in parallel in a first direction;
   rows of source regions of a first conductivity type formed in the SiC substrate and extending lengthwise in parallel in a second direction which is transverse to the first direction;
   rows of body regions of a second conductivity type opposite the first conductivity type formed in the SiC substrate below the rows of source regions;
   rows of body contact regions of the second conductivity type formed in the SiC substrate, the rows of body contact regions extending lengthwise in parallel in the second direction; and
   first shielding regions of the second conductivity type formed deeper in the SiC substrate than the rows of body regions.

2. The semiconductor device of claim 1, wherein in a plane horizontal to a main surface of the SiC substrate, each of the source regions is shaped as a parallelogram having a first pair of opposite angles which is defined by the first and second directions and greater than 90 degrees and a second pair of opposite angles which is defined by the first and second directions and less than 90 degrees.

3. The semiconductor device of claim 2, wherein each first pair of opposite angles defined by the first and second directions is approximately 135 degrees, and wherein each second pair of opposite angles defined by the first and second directions is approximately 45 degrees.

4. The semiconductor device of claim 1, wherein sections of the body regions disposed along sidewalls of the gate trenches form channel regions of the semiconductor device, and wherein opposing sidewalls of the same gate trench are aligned with the (11-20) a-face of the SiC substrate so that the channel regions extend along the (11-20) a-face.

5. The semiconductor device of claim 1, further comprising second shielding regions of the second conductivity type formed in the SiC substrate at the bottom of at least some of the gate trenches, wherein the second shielding regions are electrically contacted through adjoining ones of the first shielding regions and/or adjoining ones of the body contact regions.

6. The semiconductor device of claim 5, wherein the second shielding regions extend to a different depth in the SiC substrate than the first shielding regions.

7. The semiconductor device of claim 5, wherein the second shielding regions are formed as stripes which extend lengthwise in parallel in the first direction.

8. The semiconductor device of claim 1, wherein the second direction is transverse but not orthogonal to the first direction.

9. A method of manufacturing a semiconductor device, the method comprising:
- forming gate trenches in a SiC substrate and extending lengthwise in parallel in a first direction;
- forming rows of source regions of a first conductivity type in the SiC substrate and extending lengthwise in parallel in a second direction which is transverse to the first direction;
- forming rows of body regions of a second conductivity type opposite the first conductivity type in the SiC substrate below the rows of source regions;
- forming rows of body contact regions of the second conductivity type in the SiC substrate, the rows of body contact regions extending lengthwise in parallel in the second direction; and
- forming first shielding regions of the second conductivity type deeper in the SiC substrate than the rows of body regions.

10. The method of claim 9, further comprising:
- forming second shielding regions of the second conductivity type in the SiC substrate at the bottom of at least some of the gate trenches; and
- electrically contacting the second shielding regions through adjoining ones of the first shielding regions and/or adjoining ones of the body contact regions.

11. The method of claim 10, wherein forming the second shielding regions comprises:
- implanting a dopant species of the second conductivity type into the SiC substrate through the bottom of at least some of the trenches; and
- annealing the SiC substrate to activate the implanted dopant species.

12. The method of claim 11, wherein the first shielding regions are formed before forming the gate trenches.

13. The method of claim 9, wherein the second direction is transverse but not orthogonal to the first direction.

14. A semiconductor device, comprising:
- gate trenches formed in a SiC substrate and extending lengthwise in parallel in a first direction;
- rows of source regions of a first conductivity type formed in the SiC substrate and extending lengthwise in parallel in a second direction which is transverse to the first direction;
- rows of body regions of a second conductivity type opposite the first conductivity type formed in the SiC substrate below the rows of source regions;
- rows of body contact regions of the second conductivity type formed in the SiC substrate, the rows of body contact regions extending lengthwise in parallel in the second direction;
- first shielding regions of the second conductivity type formed deeper in the SiC substrate than the rows of body regions; and
- second shielding regions of the second conductivity type formed in the SiC substrate at the bottom of at least some of the gate trenches,
- wherein the second shielding regions are electrically contacted through adjoining ones of the first shielding regions and/or adjoining ones of the body contact regions.

15. The semiconductor device of claim 14, wherein the second shielding regions extend to a different depth in the SiC substrate than the first shielding regions.

16. The semiconductor device of claim 14, wherein the second shielding regions are formed as stripes which extend lengthwise in parallel in the first direction.

17. The semiconductor device of claim 14, wherein in a plane horizontal to a main surface of the SiC substrate, each of the source regions is shaped as a parallelogram having a first pair of opposite angles which is defined by the first and second directions and greater than 90 degrees and a second pair of opposite angles which is defined by the first and second directions and less than 90 degrees.

18. The semiconductor device of claim 17, wherein each first pair of opposite angles defined by the first and second directions is approximately 135 degrees, and wherein each second pair of opposite angles defined by the first and second directions is approximately 45 degrees.

19. The semiconductor device of claim 14, wherein sections of the body regions disposed along sidewalls of the gate trenches form channel regions of the semiconductor device, and wherein opposing sidewalls of the same gate trench are aligned with the (11-20) a-face of the SiC substrate so that the channel regions extend along the (11-20) a-face.

20. The semiconductor device of claim 14, wherein the second direction is transverse but not orthogonal to the first direction.

21. A method of manufacturing a semiconductor device, the method comprising:
- forming gate trenches in a SiC substrate and extending lengthwise in parallel in a first direction;
- forming rows of source regions of a first conductivity type in the SiC substrate and extending lengthwise in parallel in a second direction which is transverse to the first direction;
- forming rows of body regions of a second conductivity type opposite the first conductivity type in the SiC substrate below the rows of source regions;
- forming rows of body contact regions of the second conductivity type in the SiC substrate, the rows of body contact regions extending lengthwise in parallel in the second direction;
- forming first shielding regions of the second conductivity type deeper in the SiC substrate than the rows of body regions; and
- forming second shielding regions of the second conductivity type in the SiC substrate at the bottom of at least some of the gate trenches;
- wherein at least one of the first shielding regions, the second shielding regions and the body contact regions are formed such that the second shielding regions are electrically contacted through adjoining ones of the first shielding regions and/or adjoining ones of the body contact regions.

22. The method of claim 21, wherein forming the second shielding regions comprises:
- implanting a dopant species of the second conductivity type into the SiC substrate through the bottom of at least some of the trenches; and
- annealing the SiC substrate to activate the implanted dopant species.

23. The method of claim 22, wherein the first shielding regions are formed before forming the gate trenches.

24. The method of claim 21, wherein the second direction is transverse but not orthogonal to the first direction.

25. The method of claim 21, wherein in a plane horizontal to a main surface of the SiC substrate, each of the source regions is shaped as a parallelogram having a first pair of opposite angles which is defined by the first and second directions and greater than 90 degrees and a second pair of opposite angles which is defined by the first and second directions and less than 90 degrees.

\* \* \* \* \*